United States Patent
Xie et al.

(10) Patent No.: US 10,665,669 B1
(45) Date of Patent: May 26, 2020

(54) INSULATIVE STRUCTURE WITH DIFFUSION BREAK INTEGRAL WITH ISOLATION LAYER AND METHODS TO FORM SAME

(71) Applicant: GLOBALFOUNDRIES Inc., Grand Cayman (KY)

(72) Inventors: Ruilong Xie, Niskayuna, NY (US); Julien Frougier, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/285,657

(22) Filed: Feb. 26, 2019

(51) Int. Cl.
| | |
|---|---|
| *H01L 29/06* | (2006.01) |
| *H01L 21/308* | (2006.01) |
| *H01L 21/3213* | (2006.01) |
| *H01L 21/762* | (2006.01) |
| *H01L 21/8234* | (2006.01) |
| *H01L 29/66* | (2006.01) |
| *H01L 21/02* | (2006.01) |
| *H01L 27/02* | (2006.01) |
| *H01L 27/088* | (2006.01) |
| *H01L 27/105* | (2006.01) |

(52) U.S. Cl.
CPC .... *H01L 29/0649* (2013.01); *H01L 21/02381* (2013.01); *H01L 21/3081* (2013.01); *H01L 21/32139* (2013.01); *H01L 21/76224* (2013.01); *H01L 21/823431* (2013.01); *H01L 21/823481* (2013.01); *H01L 27/0207* (2013.01); *H01L 27/0886* (2013.01); *H01L 27/105* (2013.01); *H01L 29/0665* (2013.01); *H01L 29/6656* (2013.01)

(58) Field of Classification Search
CPC ............ H01L 29/0649; H01L 29/6656; H01L 29/0665; H01L 21/3081; H01L 21/32139; H01L 21/02381
See application file for complete search history.

(56) References Cited

U.S. PATENT DOCUMENTS

| | | |
|---|---|---|
| 6,784,515 B1 | 8/2004 | Li |
| 7,229,901 B2 | 6/2007 | Savage et al. |
| 7,518,195 B2 | 4/2009 | Ernst et al. |
| 8,222,696 B2 | 7/2012 | Yamazaki et al. |
| 8,273,617 B2 | 9/2012 | Thompson et al. |
| 8,389,416 B2 | 3/2013 | Luong |
| 8,637,849 B2 | 1/2014 | Deligianni et al. |

(Continued)

FOREIGN PATENT DOCUMENTS

DE 112016004265 T5 6/2018

*Primary Examiner* — Douglas M Menz
(74) *Attorney, Agent, or Firm* — Francois Pagette; Hoffman Warnick LLC

(57) ABSTRACT

An IC structure according to the disclosure includes an insulative structure overlying a substrate and set of STIs. The insulative structure includes an isolation layer contacting an upper surface of the substrate, and a diffusion break region integral with and extending from the isolation layer, wherein the diffusion break region horizontally separates a pair of upper surfaces of the isolation layer. A pair of active semiconductor layers, each positioned on a respective one of the pair of upper surfaces of the isolation layer, are adjacent opposing sidewalls of the diffusion break region. The isolation layer electrically separates the pair of active semiconductor layers from the substrate, and the diffusion break region electrically separates the pair of active semiconductor layers from each other.

20 Claims, 23 Drawing Sheets

(56) References Cited

U.S. PATENT DOCUMENTS

| | | |
|---|---|---|
| 8,809,131 B2 | 8/2014 | Bangsaruntip et al. |
| 9,461,114 B2 | 10/2016 | Obradovic et al. |
| 9,698,262 B2 | 7/2017 | Pawlak et al. |
| 9,711,414 B2 | 7/2017 | Hatcher et al. |
| 9,748,335 B1 | 8/2017 | Bentley et al. |
| 9,793,403 B2 | 10/2017 | Obradovic et al. |
| 9,947,804 B1 | 4/2018 | Frougier et al. |
| 9,960,234 B2 | 5/2018 | Huang et al. |
| 9,972,720 B2 | 5/2018 | Bae |
| 10,090,382 B1 | 10/2018 | Yu et al. |
| 2005/0072988 A1 | 4/2005 | Augusto |
| 2011/0089400 A1 | 4/2011 | Ohlsson et al. |
| 2013/0161756 A1 | 6/2013 | Glass et al. |
| 2013/0341704 A1 | 12/2013 | Rachmady et al. |
| 2014/0091279 A1 | 4/2014 | Kachian et al. |
| 2014/0091360 A1 | 4/2014 | Pillarisetty et al. |
| 2015/0179774 A1 | 6/2015 | Yamazaki et al. |
| 2015/0372111 A1 | 12/2015 | Koh et al. |
| 2016/0111284 A1 | 4/2016 | Kittl et al. |
| 2016/0126310 A1 | 5/2016 | Rodder et al. |
| 2016/0276484 A1 | 9/2016 | Kim et al. |
| 2016/0365411 A1 | 12/2016 | Yeh et al. |
| 2017/0040321 A1 | 2/2017 | Mitard |
| 2017/0053982 A1 | 2/2017 | Cai et al. |
| 2017/0179248 A1 | 6/2017 | Pawlak |
| 2017/0194430 A1 | 7/2017 | Wood et al. |
| 2017/0207313 A1 | 7/2017 | Song et al. |
| 2017/0263705 A1 | 9/2017 | Cheng et al. |
| 2017/0287788 A1 | 10/2017 | Doris et al. |
| 2017/0309706 A1 | 10/2017 | Cheng et al. |
| 2017/0323949 A1 | 11/2017 | Loubet et al. |
| 2017/0323953 A1 | 11/2017 | Cheng et al. |
| 2017/0358457 A1 | 12/2017 | Jang et al. |
| 2017/0365661 A1 | 12/2017 | Doris et al. |
| 2017/0373163 A1 | 12/2017 | Vellianitis et al. |
| 2018/0006113 A1 | 1/2018 | Cheng et al. |
| 2018/0006139 A1 | 1/2018 | Seo |
| 2018/0019305 A1 | 1/2018 | Cheng et al. |
| 2018/0033871 A1 | 2/2018 | Xie et al. |
| 2018/0047853 A1 | 2/2018 | Chang et al. |
| 2018/0269229 A1 | 9/2018 | Or-Bach et al. |
| 2019/0148242 A1 | 5/2019 | Zang et al. |
| 2019/0148373 A1 | 5/2019 | Shi et al. |

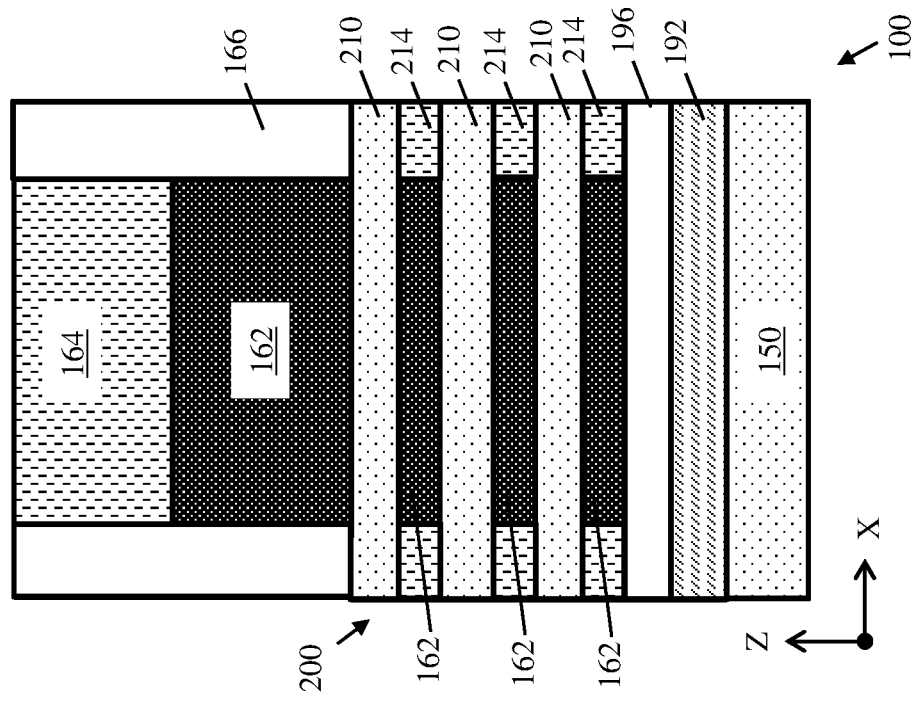
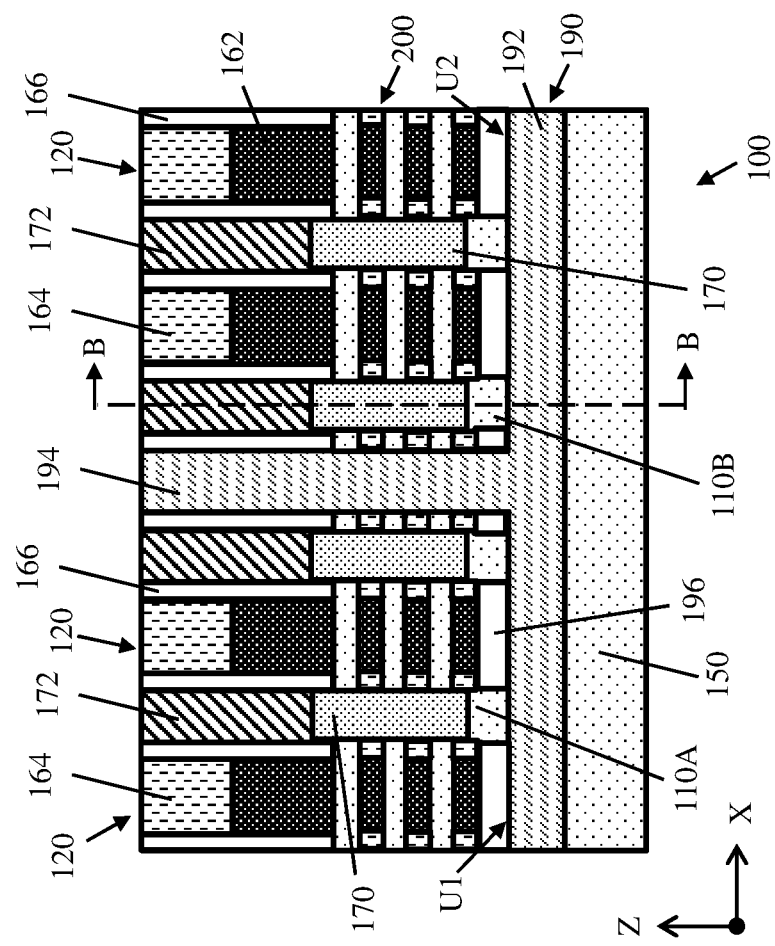
FIG. 5
FIG. 4

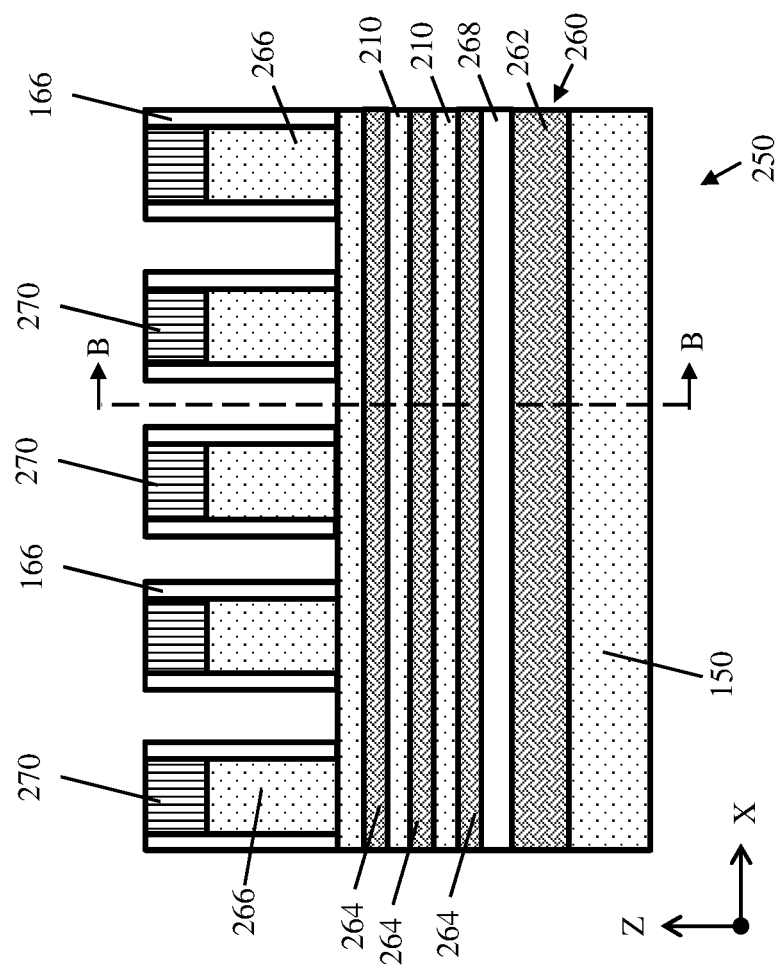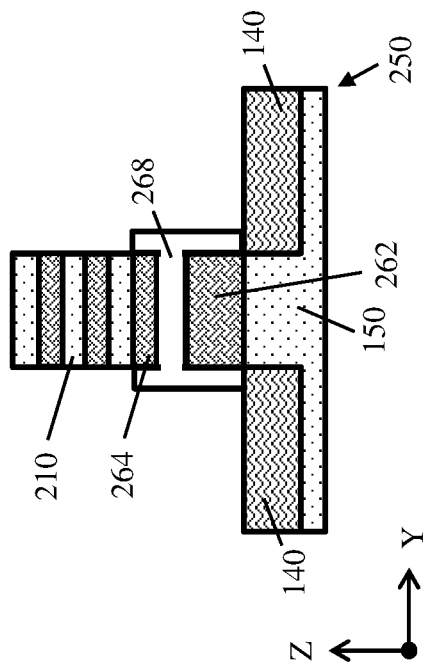

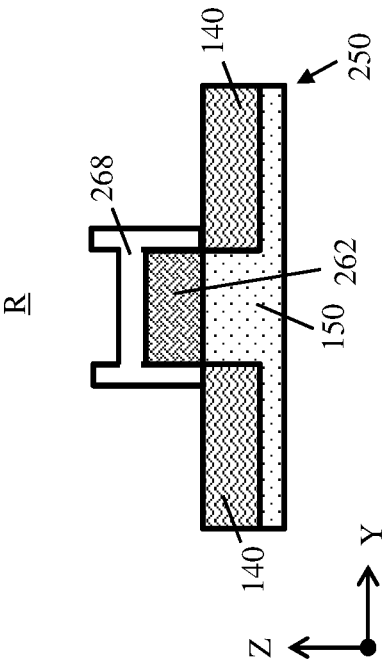
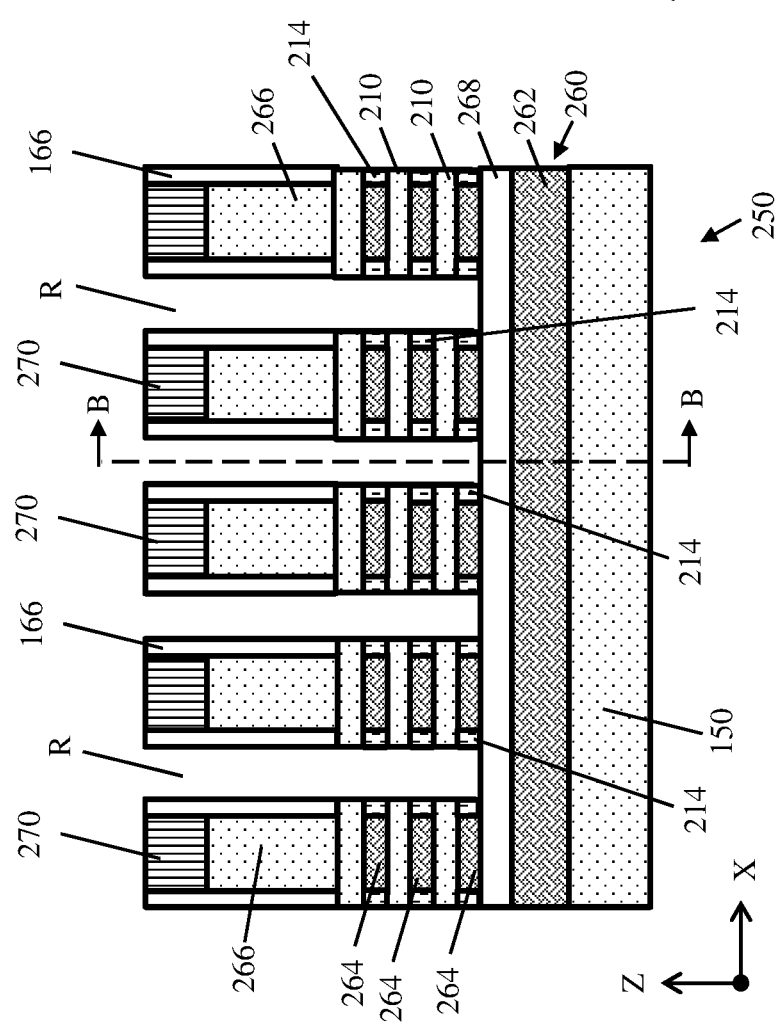
FIG. 11
FIG. 10

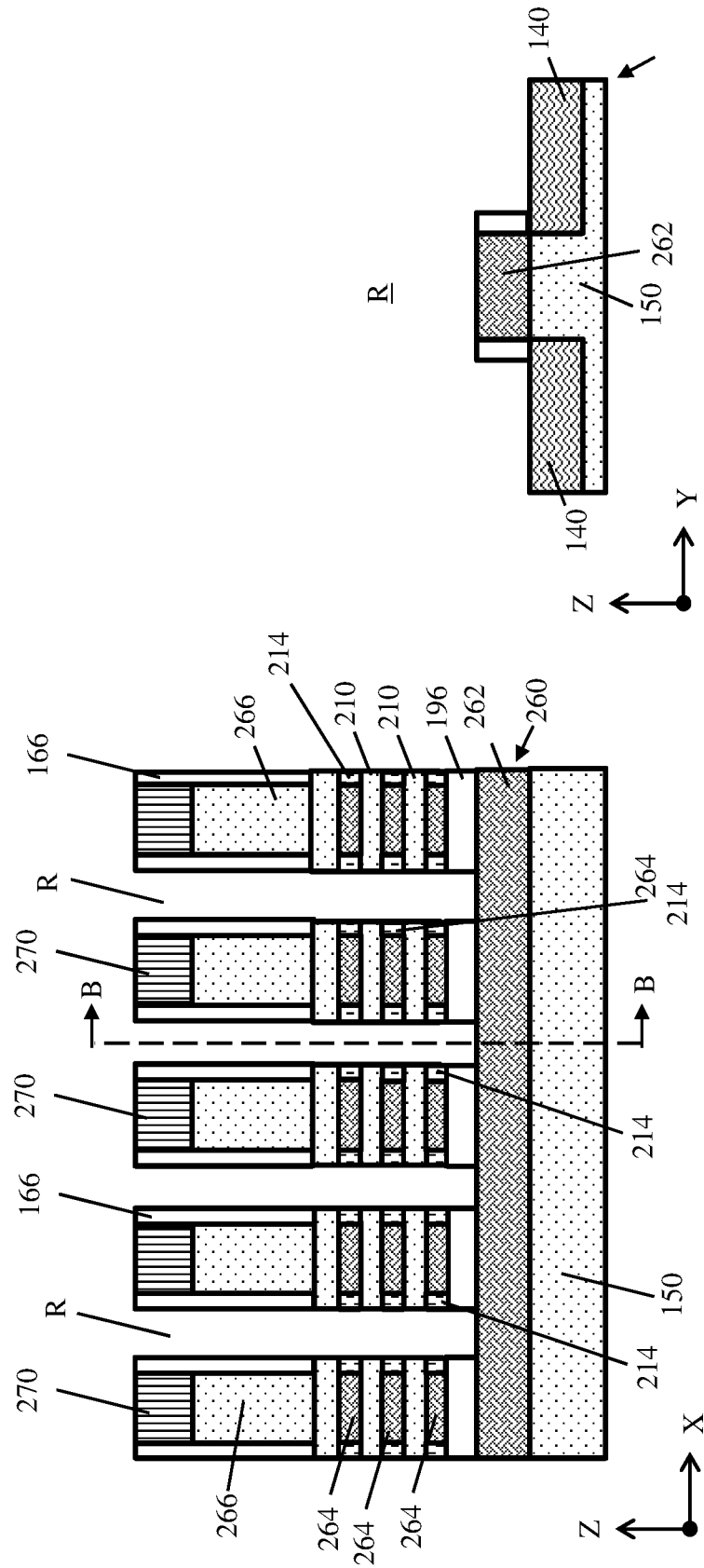

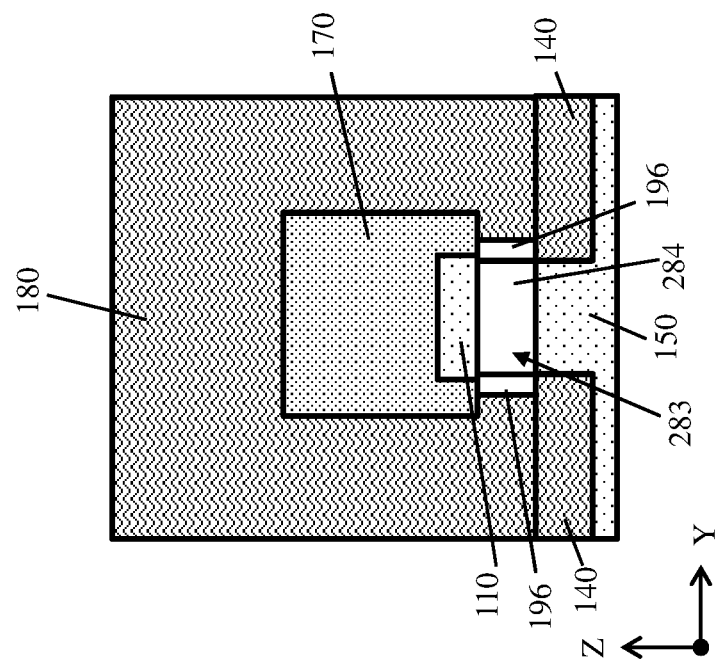
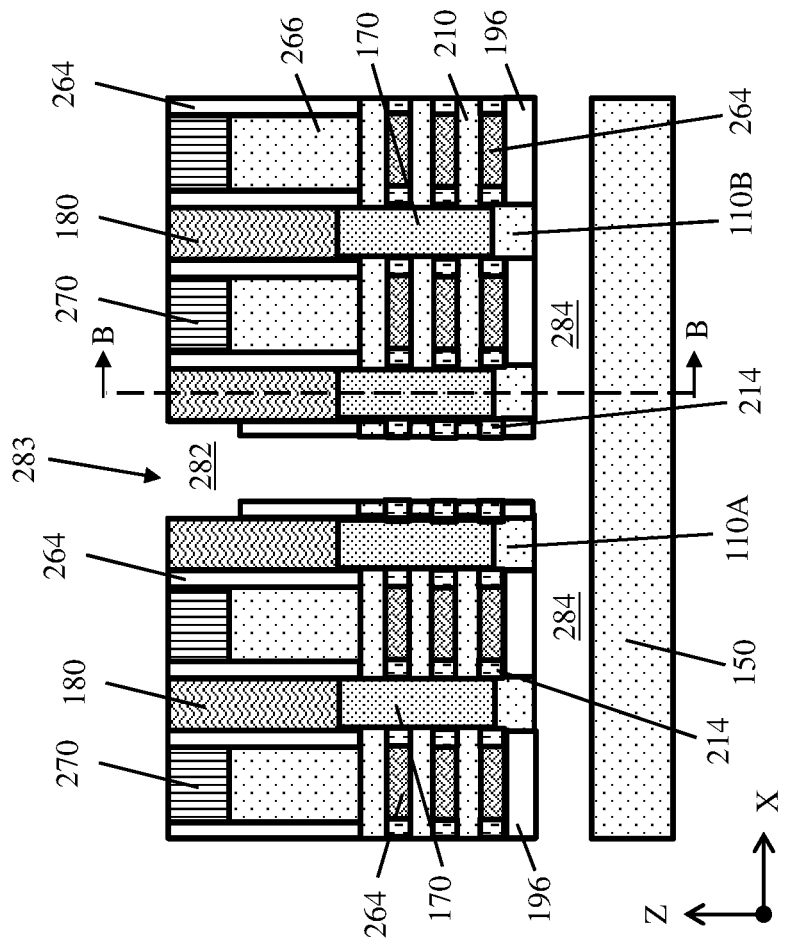
FIG. 21
FIG. 20

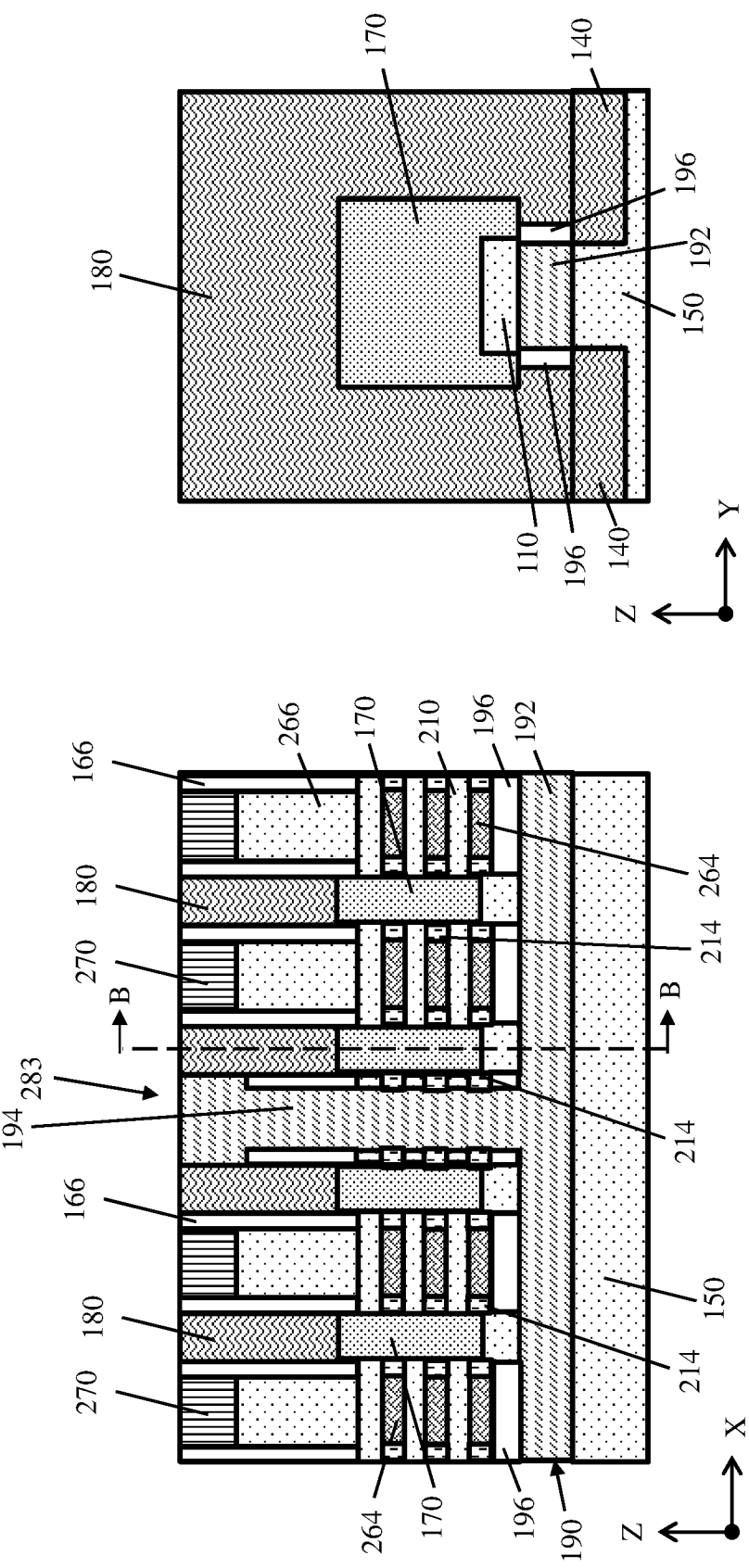

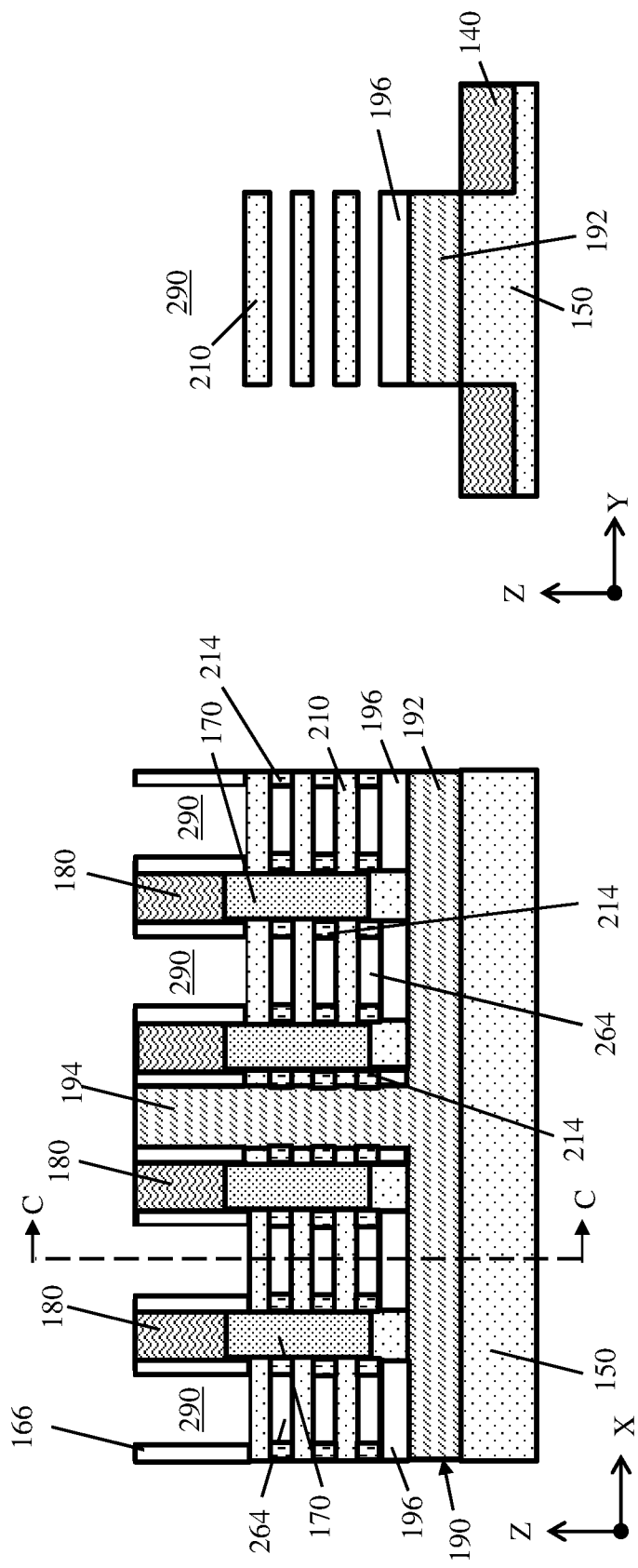

INSULATIVE STRUCTURE WITH DIFFUSION BREAK INTEGRAL WITH ISOLATION LAYER AND METHODS TO FORM SAME

BACKGROUND

Technical Field

The present disclosure relates to integrated circuit (IC) design, and more particularly to IC structures incorporating isolation and diffusion break elements, along with methods to form the same.

Related Art

Several technical challenges may arise from manufacturing transistor architectures to scale, particularly in the case of fin-type field effect transistors (FinFETs) and nanosheet transistors. For example, manufacturing a nanosheet transistor may include epitaxially growing source and drain semiconductor regions from the sidewall of individual nanosheets and the underlying semiconductor substrate. In some cases, the grown semiconductor material may create parasitic current leakage unless additional dielectric isolation further separates the source and drain semiconductor terminals from the substrate. Pathways for leaking current being underneath the nanosheets and epitaxially grown semiconductors prevent additional dielectric materials from being formed via conventional processing paradigms. This problem may be especially pronounced in cases where it is necessary to horizontally separate a series of precursor structures into individual transistors with horizontal insulation regions.

SUMMARY

A first aspect of the disclosure provides an integrated circuit (IC) structure including: a substrate; a set of shallow trench isolations (STIs) adjacent opposing sidewalls of the substrate; an insulative structure overlying the substrate, the insulative structure including: an isolation layer contacting an upper surface of the substrate, and a diffusion break region integral with and extending from the isolation layer, wherein the diffusion break region horizontally separates a pair of upper surfaces of the isolation layer; a pair of active semiconductor layers each positioned on a respective one of the pair of upper surfaces of the isolation layer, each active semiconductor layer being adjacent an opposing sidewall of the diffusion break region; and an inter-level dielectric (ILD) over the set of STIs and adjacent opposing sidewalls of the insulative structure and the pair of active semiconductor layers; wherein the isolation layer electrically separates the pair of active semiconductor layers from the substrate, and wherein the diffusion break region electrically separates the pair of active semiconductor layers from each other.

A second aspect of the disclosure provides an integrated circuit (IC) structure including: a substrate; a set of shallow trench isolations (STIs) adjacent opposing sidewalls of the substrate; an insulative structure overlying the substrate, the insulative structure including: an isolation layer contacting an upper surface of the substrate, and a diffusion break region integral with and extending from the isolation layer, wherein the diffusion break region horizontally separates a pair of upper surfaces of the isolation layer; a pair of transistors each positioned on a respective one of the pair of upper surfaces of the isolation layer, each transistor being adjacent an opposing sidewall of the diffusion break region, wherein each of the pair of transistors includes: a nanosheet stack above the isolation layer, the nanosheet stack including a plurality of semiconductor nanosheets alternating with a plurality of gate metals, a gate cap around the nanosheet stack, the gate stack including a high-k metal gate, a pair of semiconductor terminals, each semiconductor terminal adjacent a respective sidewall of the nanosheet stack, and a spacer layer horizontally between one of the pair of active semiconductor layers and the diffusion break region; and an inter-level dielectric (ILD) over the STI and adjacent opposing sidewalls of the insulative structure and the pair of transistors; wherein the isolation layer electrically separates the pair of transistors from the substrate, and wherein the diffusion break region electrically separates the pair of transistors from each other.

A third aspect of the disclosure provides a method of forming an integrated circuit (IC) structure, the method including: providing a precursor structure including: a substrate, a set of shallow trench isolations (STIs) adjacent opposing sidewalls of the substrate, a sacrificial material on a substrate, the sacrificial material having a different composition from the substrate, a plurality of semiconductor terminals on an upper surface of the sacrificial material, the plurality of active semiconductor layers being horizontally separated from each other, a plurality of nanosheet stacks over the sacrificial material and extending between adjacent pairs of the plurality of semiconductor terminals, a plurality of gate stacks, each formed around a respective one of the plurality of nanosheet stacks, and an inter-level dielectric (ILD) over the set of STIs and adjacent opposing sidewalls of the sacrificial material, the plurality of semiconductor terminals, and the plurality of gate stacks; forming a cavity within the precursor structure, wherein the forming includes: forming a first portion of the cavity by removing: a portion of the ILD and an underlying one of the plurality of semiconductor terminals, or one plurality of gate stacks and an underlying one of the plurality of nanosheet stacks, to expose a portion of the sacrificial material, and forming a second portion of the cavity vertically between the substrate and each of the plurality of semiconductor terminals and the plurality of nanosheet stacks by selectively removing the sacrificial material; and forming an insulative structure within the first and second portions of the cavity.

BRIEF DESCRIPTION OF THE DRAWINGS

The embodiments of this disclosure will be described in detail, with reference to the following figures, wherein like designations denote like elements, and wherein:

FIG. 4 shows a cross-sectional view in plane X-Z of an IC structure with nanosheet stacks according to embodiments of the disclosure.

FIG. 5 shows an expanded cross-sectional view in plane X-Z of a nanosheet stack in an IC structure according to embodiments of the disclosure.

FIG. 8 shows a cross-sectional view in plane X-Z of removing one sacrificial material and forming an etch stop layer according to embodiments of the disclosure.

FIG. 9 shows a cross-sectional view in plane Y-Z, along line B-B of FIG. 8, of removing one sacrificial material and forming an etch stop layer according to embodiments of the disclosure.

FIG. 10 shows a cross-sectional view in plane X-Z of forming recesses to expose the etch stop layer and forming inner spacers according to embodiments of the disclosure.

FIG. 11 shows a cross-sectional view in plane Y-Z, along line B-B of FIG. 10, of forming recesses to expose the etch stop layer according to embodiments of the disclosure.

FIG. 12 shows a cross-sectional view in plane X-Z of forming recesses in the etch stop layer to expose the sacrificial material layer according to embodiments of the disclosure.

FIG. 13 shows a cross-sectional view in plane Y-Z, along line B-B of FIG. 12, of forming recesses on the etch stop layer to expose the sacrificial material layer according to embodiments of the disclosure.

FIG. 20 shows a cross-sectional view in plane X-Z of forming a second portion of the cavity according to embodiments of the disclosure.

FIG. 21 shows a cross-sectional view in plane Y-Z, along line B-B of FIG. 20, of the structure while forming the second portion of the cavity according to embodiments of the disclosure.

FIG. 22 shows a cross-sectional view in plane X-Z of forming an insulative structure within the cavity according to embodiments of the disclosure.

FIG. 23 shows a cross-sectional view in plane Y-Z, along line B-B of FIG. 22, of forming an insulative structure within the cavity according to embodiments of the disclosure.

FIG. 26 shows a cross-sectional view in plane X-Z of removing sacrificial nanosheets according to embodiments of the disclosure.

FIG. 27 shows a cross-sectional view in plane Y-Z, along line C-C of FIG. 26, of removing sacrificial nanosheets according to embodiments of the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to integrated circuit (IC) design, and more particularly provides for various IC structures with a diffusion break integral with a bottom dielectric isolation layer, and methods of forming the same. Embodiments of the disclosure are designed for seamless integration into a variety of transistor architectures and related processing paradigms. Embodiments of the disclosure provide a single insulative structure which horizontally separates aligned transistor materials, while also physically separating the transistor materials from underlying substrate layers and/or other materials. The insulative structure in embodiments of the present disclosure is structurally and operationally distinct from the buried insulator ("BOX") layer and/or other insulating materials formed beneath a semiconductor substrate. In some cases, embodiments of the disclosure may electrically and physically separate multiple Fin-FET transistors. FinFET transistors include fin-shaped active semiconductor material, with a transversely-extending gate in contact its upper and sidewall surfaces. In other cases, embodiments of the disclosure may electrically and physically separate multiple nanosheet transistors. In the case of a nanosheet transistor, electrical connection with the various nanosheets in a gate region acting as transistor channel may be provided through a semiconductive source/drain semiconductor terminal grown from the edges of the semiconductor nanosheets. Various embodiments of the disclosure may also be operable with other transistor architectures.

It will also be understood that when an element such as a layer, region, or substrate is referred to as being "on" or "over" another element, it may be directly on the other element or intervening elements may also be present. In contrast, when an element is referred to as being "directly on" or "directly over" another element, there are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Methods as described herein may be used in the fabrication of IC chips. The resulting integrated circuit chips may be integrated with other chips, discrete circuit elements, and/or other signal processing devices as part of either (a) an intermediate product, such as a motherboard, or (b) an end product. The end product can be any product that includes integrated circuit chips.

Figure 1:
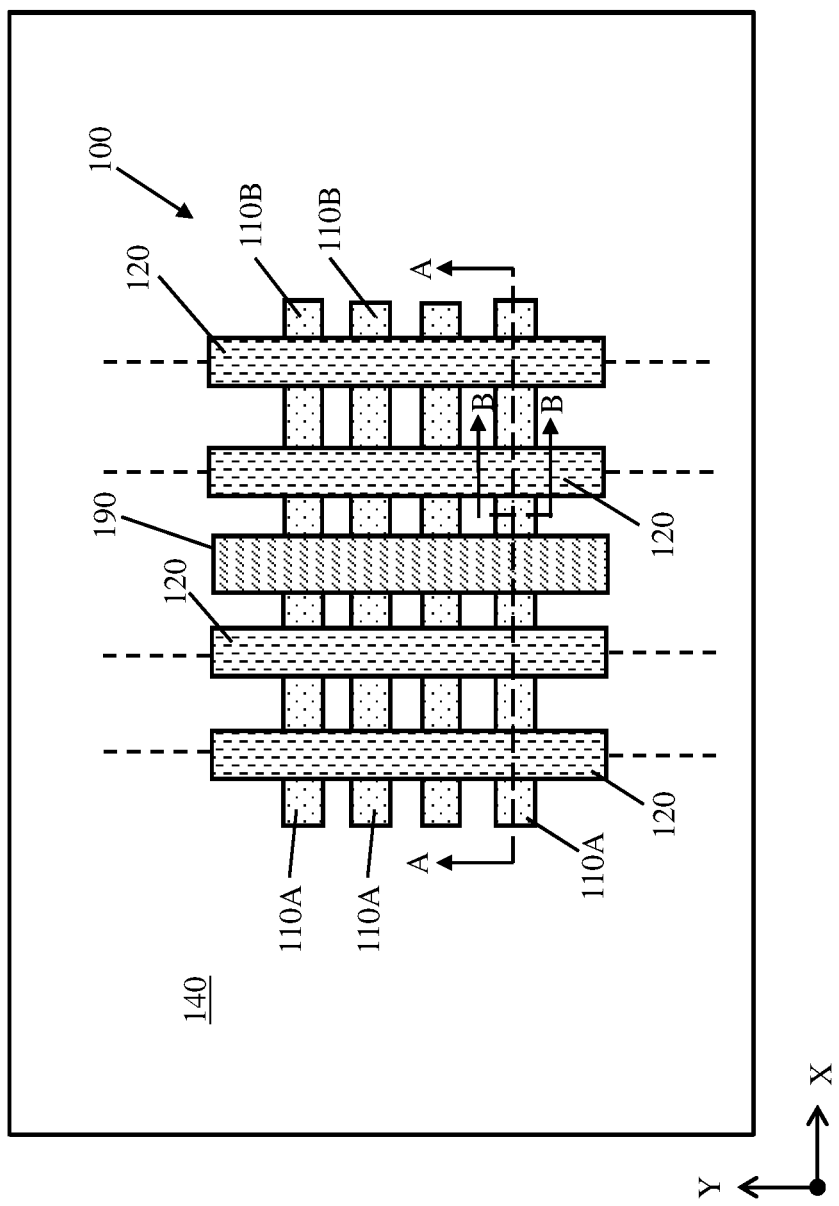
FIG. 1 shows a plan view in plane X-Y of a plurality of semiconductor layers and gate stacks to be processed according to embodiments of the disclosure.

FIG. 1 provides a plan view of a structure 100 according to embodiments of the disclosure. The example structure 100 of FIG. 1 provides one configuration of elements according to embodiments of the disclosure, but it is understood that embodiments of the disclosure may be implemented in different designs without significant changes to the various example techniques discussed herein. Structure 100 can include a set (i.e., one or more) of semiconductor regions from which multiple transistor structures may be formed. Semiconductor regions can be formed in a variety of ways from an initial substrate. Various embodiments may include regions of semiconductor material in the form of active semiconductor layers (simply "active layers" hereafter) 110A, 110B extending in parallel with each other. Throughout the disclosure, active layers 110A, 110B may be referred to collectively as active layers 110. FIG. 1 provides an example including four active layers 110, but structure 100 may include any desired number of active layers 110. Structure 100 may also include a set (i.e., one or more) gate structures 120 each extending transversely over active layers 110. Although active layer(s) 110 are provided as an illustrated example, embodiments of the disclosure may be formed on any type of semiconductor region (e.g., bulk semiconductor material) without significant modifications. Various additional components positioned alongside or above active layers 110 and gate structures 120 are omitted solely for clarity of illustration in plane X-Y. A shallow trench isolation (STI) 140 of structure 100, may be positioned underneath and/or adjacent to active layer(s) 110 and gate structure(s) 120. STI(s) 140 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Figure 2:
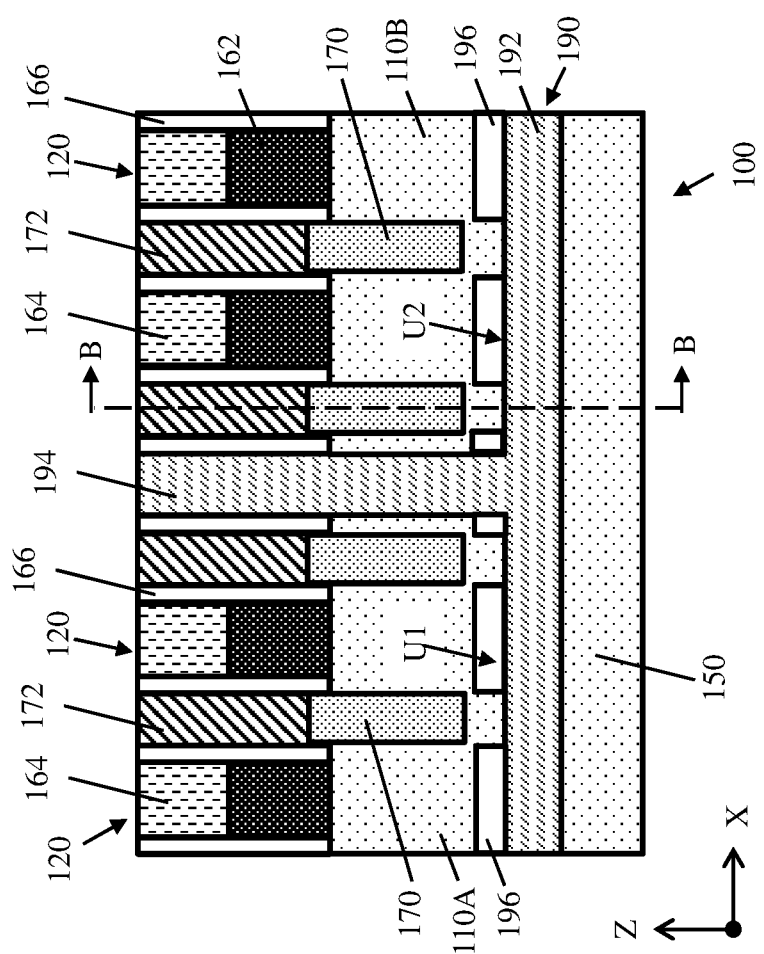
FIG. 2 shows a cross-sectional view in plane X-Z along line A-A of FIG. 1, depicting an integrated circuit (IC) structure according to embodiments of the disclosure.

Referring to FIG. 2, active layers 110 and gate structures 120 of structure 100 are shown in further detail. Each active layer 110 may be above, and originally formed from, an underlying semiconductor substrate 150, e.g., by converting portions of substrate 150 into a sacrificial material and removing the converted sacrificial material to separate active layer(s) 110 from the original substrate 150. Substrate 150 may include, e.g., one or more currently-known or later developed semiconductive substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

One active layer 110 is separately identified as first active layer 110A, and another active layer 110 is separately identified as second active layer 110B. First and second active layers 110A, 110B may be identical to each other, but located over different portions of substrate 150. First and second active layer(s) 110A, 110B may appear in locations different from those in the accompanying FIGS., e.g., portions of substrate 150 which are not in a single plane or substantially horizontally aligned. As noted herein, active layers 110A, 110B may be initially formed as a single layer and subsequently separated into two or more distinct layer by forming a diffusion break (SDB) to horizontally separate one active semiconductor material into two active layers 110A, 110B.

Figure 3:
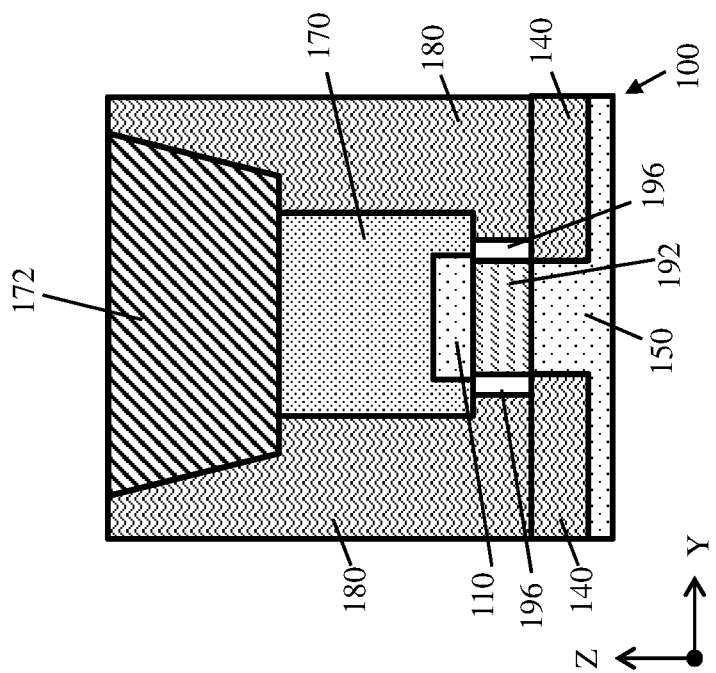
FIG. 3 shows a cross-sectional view in plane Y-Z, along line B-B of FIGS. 1 and 2, of the IC structure according to embodiments of the disclosure.

Substrate 150 may have a variety of configurations, such as the depicted bulk silicon configuration. Substrate 150 may also have a silicon-on-insulator (SOI) configuration that includes a bulk silicon layer, a buried insulation layer and an active layer, wherein semiconductor devices are formed in and above the active layer. Substrate 150 may be made of silicon or it may be made of materials other than silicon. Thus, the terms "substrate" or "semiconductor substrate" should be understood to cover all semiconducting materials and all forms of such materials. Substrate 150 may be formed by forming a semiconductor material on an underlying structure (not shown). For the purposes of example and simplicity, other materials and/or layers positioned beneath substrate 150 have been omitted from the accompanying figures. In addition, the various cross-sectional views in plane X-Z herein are shown to be in a "cross-gate direction." Substrate 150 and active semiconductor layers 110 formed therefrom may be positioned laterally adjacent to a set of STI(s) 140 as shown in FIG. 3, and/or other materials for electrically isolating distinct transistor structures.

Each gate structure 120 may provide additional active components for controlling the electrical properties of active layer(s) 110A, 110B. Each gate structure 120 in some cases may include metals and/or other structures formed using a replacement metal gate (RMG) processing paradigm. Gate structures 120 may cover one or more active semiconductor layers 110 positioned above substrate 150, e.g., by coating exposed sidewalls and an upper surface of active layer(s) 110. Gate structures 120 may include multiple subcomponents. A gate dielectric film (not shown) be formed as a thin layer on active layer(s) 110 to separate active layer(s) 110 from materials formed thereon. Gate structure 120 may also include a gate region 162 formed on active layer(s) 110. Gate region 162 may include one or more precursor semiconductor materials formed on active layer(s) 110. Embodiments of the disclosure may be implemented without regard to whether gate region 162 is formed of a precursor material (e.g., semiconductor) or an active material (e.g., metal). Gate structures 120 also may include a gate cap 164 over gate region 162. Gate cap 164 may include one or more insulative materials configured to protect underling portions of gate region 162 from being removed, modified, implanted, etc., as other portions of a structure are formed. For instance, gate cap 164 may include silicon nitride (SiN) and/or other insulative materials noted herein.

Gate structure 120 may also include spacers 166 formed adjacent to active layer(s) 110 and gate region 162. Spacer(s) 166 may be provided as one or more bodies of insulating material formed on exposed portions of STI(s) 140 and/or gate structure(s) 120, e.g., by deposition/etching, thermal growth, etc. STI 140 is depicted with different cross-hatching in FIG. 1 as compared to subsequent FIGS. 2-28 solely for ease of illustration. Spacer(s) 166 may be formed adjacent to active layer(s) 110 and gate region 162 to electrically and physically separate these materials from other components of structure 100. Spacer(s) 166 may include one or more low-K dielectric materials, i.e., dielectric materials with a dielectric constant of at most approximately 3.9. Spacer 166, for example, may include one or more insulative oxide and/or nitride materials. In some cases, spacer(s) 166 may include one or more insulative materials included in STI(s) 140 or a different insulative material. As noted elsewhere herein, spacer(s) 166 may be a preliminary spacer material selected for ease of removal and replacement in subsequent processing.

Etching generally refers to the removal of material (e.g., various structures formed above a substrate), and is often performed with a mask in place so that material may selectively be removed from certain areas of the substrate, while leaving the material unaffected in other areas of the substrate. There are generally two categories of etching, (i) wet etch, and (ii) dry etch. Wet etch is performed with a solvent (such as an acid or a base) which may be chosen for its ability to selectively dissolve a given material (such as oxide), while, leaving another material (such as polysilicon or nitride) relatively intact. This ability to selectively etch given materials is fundamental to many semiconductor fabrication processes. A wet etch will generally etch a homogeneous material (e.g., nitride) isotopically, but a wet etch may also etch single-crystal materials (e.g. silicon wafers) anisotopically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotopic. Ion milling, or sputter etching, bombards the wafer with energetic ions of noble gases that approach the wafer approximately from one direction, and therefore this process is highly anisotopic. Reactive-ion etching (RIE) operates under conditions intermediate between sputter and plasma etching and may be used to produce deep, narrow features, such as STI trenches.

Structure 100 may include a set of semiconductor terminals 170 formed within and/or between respective pairs of active layers 110. Semiconductor terminals 170 may be formed by implanting dopants into active layer(s) 110 and/or removing some portions of active layer(s) 110 and growing additional doped semiconductor material from exposed sidewalls or cavities within active layer(s) 110. The terms "epitaxial growth and/or deposition" and "epitaxially formed and/or grown" mean the growth of a semiconductor material on a deposition surface of a semiconductor material, also known as a "seed layer," in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Source and drain contacts (simply "contacts" hereafter) 172 to overlying circuit elements may be formed on active layer(s) 110 alongside and between gate structure(s) 120. Contacts 172 may include any currently known or later developed conductive material configured for use in an electrical contact, e.g., copper (Cu), aluminum (Al), tungsten (W), cobalt (Co), titanium (Ti), etc. Contacts 172 may additionally include refractory metal liners (not shown) positioned on their sidewalls to prevent electromigration degradation, shorting to other components, etc. As shown specifically in FIG. 3, semiconductor terminals 170 and overlying contacts 172 may be formed within an inter-layer dielectric (ILD) 180 for electrically insulating various components above STI(s) 140. ILD 180 may be formed above active layers 110, gate structures 120, STI(s) 140, and other previously-formed materials, e.g., by deposition or other techniques of forming an insulative material on a structure. ILD 180 may include one or more of the same insulating material as STI(s) 140, spacer(s) 166, or may include a different electrically insulative material.

Embodiments of structure 100 include an insulative structure 190 overlying STI(s) 140 and substrate 150. Insulative structure 190 includes multiple subcomponents each configured to serve different purposes in structure 100. In any case, insulative structure 190 may include one or more of the insulative materials described herein relative to, e.g., STI(s) 140, gate caps 164, ILD(s) 180, and/or may include other electrically insulative materials. According to one example, where STI(s) 140 and ILD(s) 180 include an oxide insulator, insulative structure 190 may include a nitride insulator or other low-k material different from that of STI(s) 140 and/or ILD(s) 180. Insulative structure 190 may include an isolation layer 192 contacting an upper surface of substrate 150 and set of STI(s) 140. Insulative structure 190 may also include a diffusion break region 194 integral with and extending from isolation layer 192. Diffusion break region 194 may horizontally separate a pair of upper surfaces U1, U2 of isolation layer 192 from each other, with each upper surface U1, U2 corresponding to one active layer 110A, 110B. Diffusion break region 194 may constitute either a single diffusion break (SDB) or double diffusion break (DDB), e.g., by being formed in place of a previously-formed gate structure 120 or contact 172 as discussed elsewhere herein.

Diffusion break region 194 is shown to occupy the space between two contacts 172 in FIG. 2 solely for the sake of example. Diffusion break region 194, as shown, may extend upward from isolation layer 192 and may be integral with isolation layer 192. In this context, the term "integral" denotes that each portion 192, 194 of insulative structure 190 may be formed by a single deposition of insulative material as noted elsewhere herein, and may be distinguishable from each other solely based on their position. Thus, insulative structure 190 may lack any identifiable structural interface between isolation layer 192 and diffusion break region 194. A vertical height of isolation layer 192 may be at most approximately ten nanometers (nm) between substrate 150 and active semiconductor layers 110A, 110B. A horizontal width of diffusion break region 194 between active semiconductor layers 110A, 110B may be at most approximately twenty nm. Structure 100 may also include channel spacers 196 on insulative structure 190 to further separate portions of active layer 110A, 110B from substrate 150. Active layer(s) 110A, 110B thus may contact and overlie portions of channel spacers 196. As discussed elsewhere herein, channel spacer(s) 196 may in some cases be originally formed over a sacrificial material, and remain in place as the sacrificial material is removed and replaced with insulative structure 190.

Isolation layer 192 and diffusion break region 194 of insulative structure 190 in some cases may be formed at the same time using a conformal liner deposition process such as atomic layer deposition (ALD). In this specific example, a seam (not shown) may be visible were the material pinches-off cavity 283 at approximately the center of isolation layer 192 and the center of diffusion break region 194. In this case, however, the seam would cause isolation layer 192 and diffusion break region 194 to intersect each other perpendicularly at the intersection of isolation layer 192 and diffusion break region 194. Depending on the horizontal length dimension of diffusion break region 194 and the vertical thickness of isolation layer 192, a small air-gap (likely triangular shape) could potentially be encapsulated in the region were the seams of isolation layer 192 and diffusion break region 194 intersect.

Referring now FIG. 4, a further embodiment of structure 100 implemented with a set of nanosheet stacks 200 is shown. Other features of structure 100 outside nanosheet stack 200 are omitted from FIG. 4 for the sake of illustration. Nanosheet stacks 200 may be designed for inclusion in a gate all-around (GAA) transistor, alternatively known in the art as a nanosheet transistor. Nanosheet stacks 200 include a plurality of semiconductor nanosheets 210 (FIG. 5) alternating with portions of gate region 162 filling space between each semiconductor nanosheet, as discussed in more detail herein. Nanosheet stacks 200 are a type of active semiconductor layer as discussed herein, and thus may be substituted for semiconductor fins and/or other types of active semiconductor material.

As shown in FIG. 4, other features of structure 100 may be substantially unchanged regardless of whether nanosheet stacks 200 or another type of active semiconductor layer 110 is used. Specifically, insulative structure 190 includes isolation layer 192 contacting the upper surface of substrate 150 as well as diffusion break region 194 integral with and extending from isolation layer 192. Diffusion break region 194 horizontally separates a pair of upper surfaces U1, U2 of isolation layer 192 on opposite sides of diffusion break region 194. A pair of nanosheet stacks 200 may be located on respective upper surfaces U1, U2 of isolation layer 192. Other components and features of structure 100 with nanosheet stack(s) 200 may be similar or identical to embodiments without nanosheet stack(s) 200, discussed elsewhere herein.

Nanosheet stack 200 may include semiconductor nanosheets 210 initially formed on substrate 150, e.g., by epitaxial growth. Semiconductor nanosheets 210 may alternate with regions of gate region 162 over substrate 150. A first layer of sacrificial material (not shown) may be formed on substrate 150 before remaining layers of nanosheet stack 200, before being removed and replaced by isolation layer 192 of insulative structure 190, and channel spacer(s) 196, where applicable. Nanosheet stack 200 may include, e.g., several alternating semiconductor nanosheets 210 separated by portions of gate region 162 vertically between and horizontally alongside each semiconductor nanosheet 210. Semiconductor nanosheets 210 may initially be formed as alternating layers between layers of sacrificial material (not shown). In this case, the sacrificial material may be removed to form an opening to be filled by gate region 162 as discussed by example elsewhere herein. Semiconductor nanosheets 210 can be formed from any currently known or later developed semiconductor material, e.g., silicon, with the various example compositions of substrate 150 being operable for use in semiconductor nanosheets 210. Gate region 162 may have the same composition as other embodiments discussed herein. In an example, each nanosheet 210 in stack 200 can each have a thickness of, e.g., less than approximately 5.0 nanometers (nm).

Nanosheet stack 200 may also include additional materials for physically and electrically separating gate region 162 from adjacent source or drain contacts 172. A spacer layer 214 may be formed by forming recesses (not shown) within gate region 162 and subsequently forming, e.g., a nitride liner and/or insulative material which "pinches off" the recesses to yield layers of spacer layer 214 between alternating nanosheets 210 in nanosheet stack 200. Each portion of spacer material in spacer layer 214 may alternatively be known as an "inner spacer." Spacer layer 214 may be formed before gate region 162, e.g., by recessing sacrificial material (not shown), forming spacer layer 214 in the recessed material, and subsequently removing and replacing the sacrificial material to form gate region 162.

Methods of the present disclosure may include, e.g., modifying, removing, and adding to a precursor structure 250 (FIG. 16) to form embodiments of structure 100. The subsequently discussed FIGS. 6-15 provide an example process to form precursor structure 250, but it is understood that currently known or later developed alternative techniques may be implemented to form the precursor structure 250 or a similar precursor structure.

Figure 7:
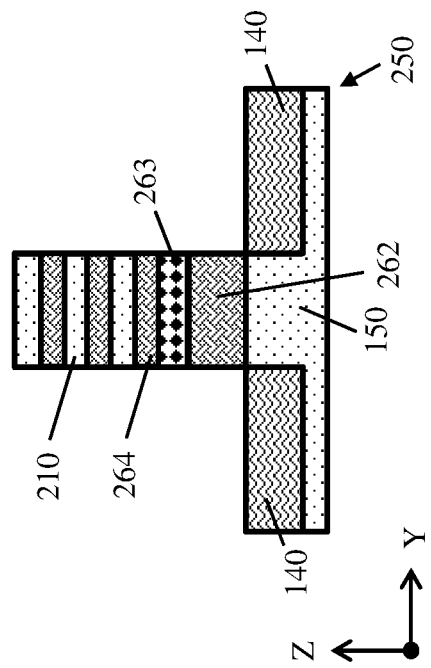
FIG. 7 shows a cross-sectional view in plane Y-Z, along line B-B of FIG. 6, of forming a stack of sacrificial materials and nanosheets according to embodiments of the disclosure.
Figure 6:
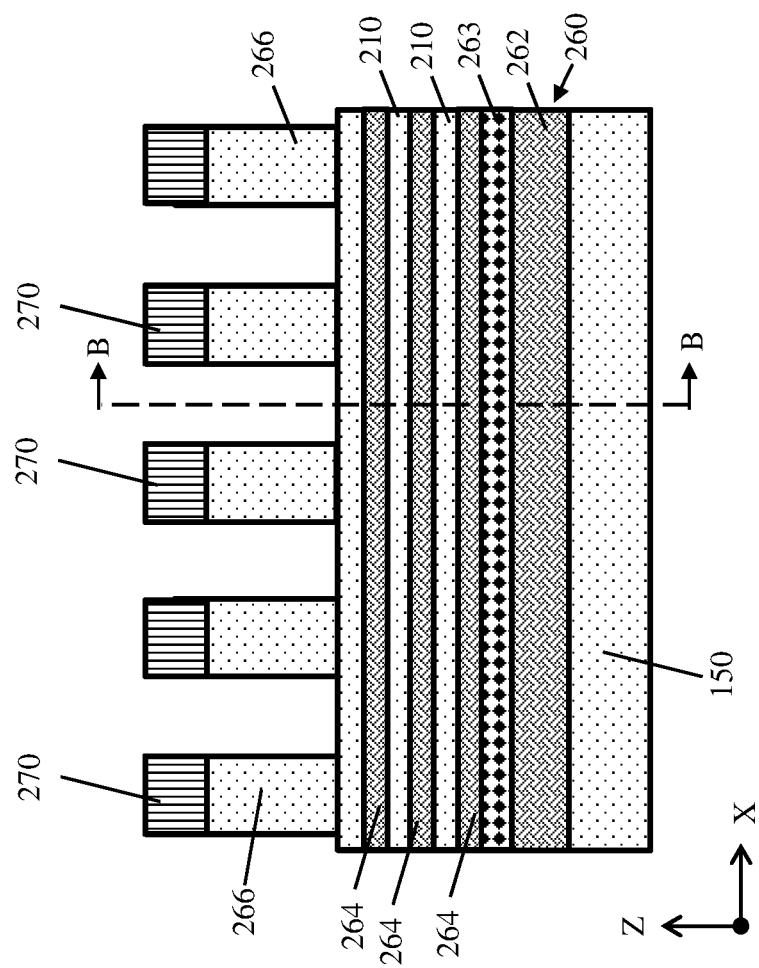
FIG. 6 shows a cross-sectional view in plane X-Z of forming a stack of sacrificial materials and nanosheets according to embodiments of the disclosure.

Referring to FIGS. 6 and 7, a sacrificial material 260 may be formed on substrate 150. Sacrificial material 260 may have a different material composition from that of substrate 150, as well as other semiconductor materials (e.g., active semiconductor layers 110) whether previously-formed or subsequently formed. Sacrificial material 260 may include, e.g., a base layer 262 formed on substrate 150. A sacrificial separator 263 may be formed on base layer 262 to cover the entirety of base layer 262, and may have a different material composition from base layer 262. Several stacks of semiconductor nanosheets 210 may be formed above base layer 262. As shown, each semiconductor nanosheet 210 can vertically alternate with layers of sacrificial nanosheets 264. According to an example embodiment, base layer 262 and sacrificial nanosheets 264 of sacrificial material 260 can include silicon germanium (SiGe). Sacrificial separator 263 similarly may include SiGe, but with a larger concentration of Ge relative to base layer 262 and/or sacrificial nanosheets 264. According to an example, base layer 262 and sacrificial nanosheets 264 may have a majority Si concentration, while sacrificial separator 263 may have a majority Ge concentration. Selected portions of sacrificial material 260 may be replaced with one or more conductive materials in subsequent processing as noted herein. Base layer 262 of sacrificial material 260 can be formed on substantially the entire substrate 150 by epitaxial growth. Sacrificial separator 263 similarly may be formed on base layer 262 by epitaxial growth and/or deposition. Nanosheets 210, 264 may be formed over sacrificial separator 263, e.g., by repeated epitaxial growth processes. In the example depicted herein, the structure is formed to include three semiconductor nanosheets 210. However, in practice, any desired number of semiconductor nanosheets 210 may alternate with any desired number of sacrificial nanosheets 264 to suit a particular application. Additionally, nanosheets 210, 264 need not be formed to the same thickness, although that may be the case in some applications.

Turning to FIGS. 8 and 9, sacrificial separator 263 (FIGS. 6, 7) may be replaced with insulative components to physically and electrically separate active and non-active components of an eventual device structure. Sacrificial separator 263 may be removed, e.g., by selective etch with one or more etchants configured to remove sacrificial separator 263 while leaving other components substantially intact. According to one example, one or more wet or dry etchants selective to majority Ge materials may be used to remove sacrificial separator 263. According to one example, the etchant may include a vapor phase dry etchant (e.g., HCl or ClF$_3$-based materials) to provide high selectivity and etch rate differences for differing concentrations of Ge in a material. Portions of gate stack(s) 266 may continue to hold materials above sacrificial separator 263 after it is removed. Afterword, an etch stop layer 268 may be formed in place of sacrificial separator 263, e.g., by conformal deposition and/or etching. As shown specifically in FIG. 9, etch stop layer 268 may be directly between base layer 262 and one sacrificial nanosheet 264, while also laterally abutting sidewalls of these components. During the same process, spacers 166 may be formed on sidewalls of gate stack(s) 266 and gate cap(s) 270. Etch stop layer 268 thus may include one or more of the example insulating materials discussed elsewhere herein regarding spacers 166. Sacrificial separator 263 and etch stop layer 268 will determine the shape and size of subsequently-formed source and drain regions, as well as channel separators 196 as described elsewhere herein.

FIGS. 10 and 11 depict, removing portions of nanosheets 210, 264 to expose etch stop layer 268. Here, gate cap(s) 270 may serve as a masking material to allow exposed surfaces of nanosheets 210, 264 to be etched non-selectively. The non-selective etching may remove portions of each nanosheet 210, 264 not covered by gate stack(s) 266, gate cap(s) 270, and/or spacer(s) 166. The applied etchant may be non-selective to the composition of spacer(s) 166 and etch stop layer 268, thereby leaving etch stop layer 268 intact as well as other materials thereunder. As shown, the etching will form a set of recesses R horizontally between gate stacks 266. Sets of inner spacers 214 may subsequently be formed on sidewalls of sacrificial nanosheets 214, e.g., by performing a selective etch and thereafter conformally depositing spacer material adjacent sacrificial nanosheets and between semiconductor nanosheets 210.

Referring now to FIGS. 12 and 13, embodiments of the disclosure may include removing exposed surfaces of etch stop layer 268 (FIGS. 8-11), e.g., by continued downward etching with gate cap(s) 270 in place and/or with one or more etchants selective to etch stop layer 268 in recesses R. As shown, portions of etch stop layer 268 located beneath nanosheets 210, 264 will remain intact and not be etched. The remaining portions of etch stop layer 268 become channel spacer(s) 196.

Figure 15:
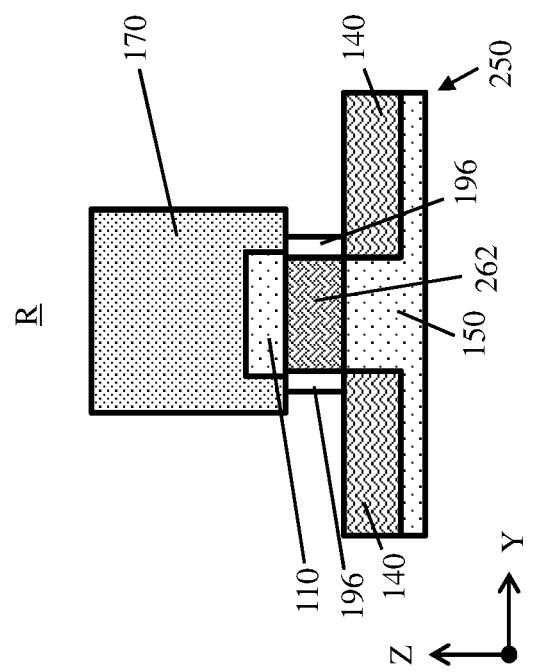
FIG. 15 shows a cross-sectional view in plane Y-Z, along line B-B of FIG. 14, of forming an active semiconductor layer and semiconductor terminal according to embodiments of the disclosure.
Figure 14:
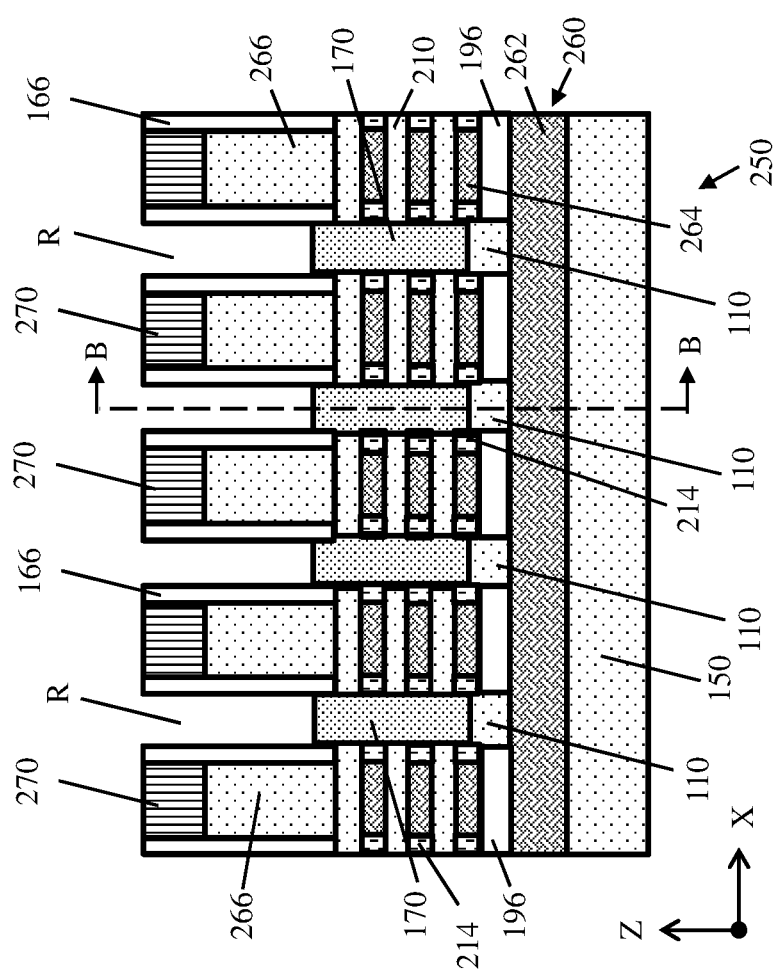
FIG. 14 shows a cross-sectional view in plane X-Z of forming an active semiconductor layer and semiconductor terminal according to embodiments of the disclosure.

FIGS. 14 and 15, the source and drain components of an eventual transistor structure may be formed within recesses R. With base layer 192 exposed from the partial removal of etch stop layer 268 (FIGS. 8-11), additional semiconductor material may be grown epitaxially on base layer 262. However, due to the grown material's use in an eventual transistor structure, the grown semiconductor material may be grown from a Si seed layer (e.g., conformally deposited on base layer 262) to create a region of semiconductor without significant Ge content. The grown semiconductor material takes the form of active layer(s) 110 in precursor structure 250. Next, semiconductor terminal(s) 170 may be formed by growing an additional and distinct semiconductor material on active layer(s) 110. The grown epitaxial material may have a different composition from that of active layer(s) 110, e.g., by including dopants configured to adjust the electrical conductivity through active layer(s) 110. In further embodiments, semiconductor terminal(s) 170 may be doped in situ after the initial semiconductor terminal(s) 170 material is formed. In any case, these processes will form precursor structure 250 according to embodiments of the disclosure.

Figure 17:
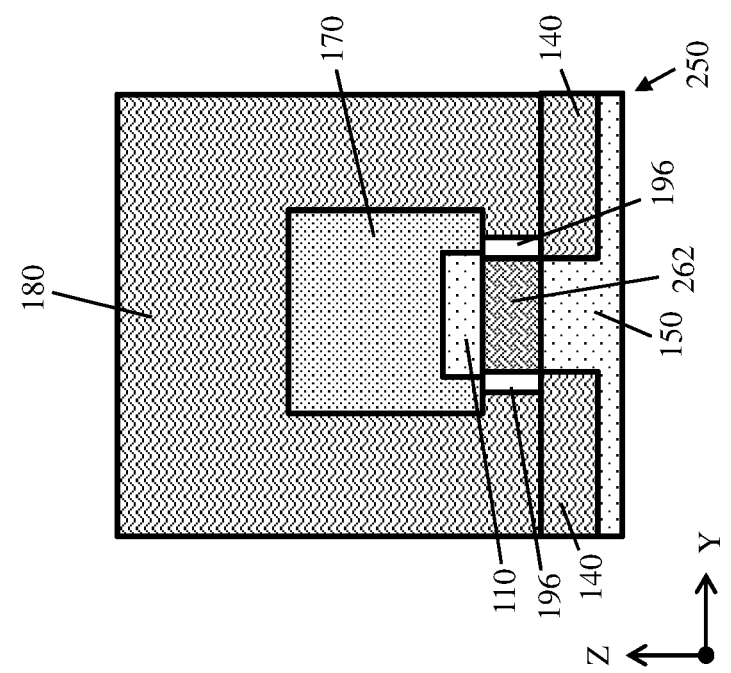
FIG. 17 shows a cross-sectional view in plane Y-Z, along line B-B of FIG. 16, of a precursor structure to be processed in methods according to embodiments of the disclosure.
Figure 16:
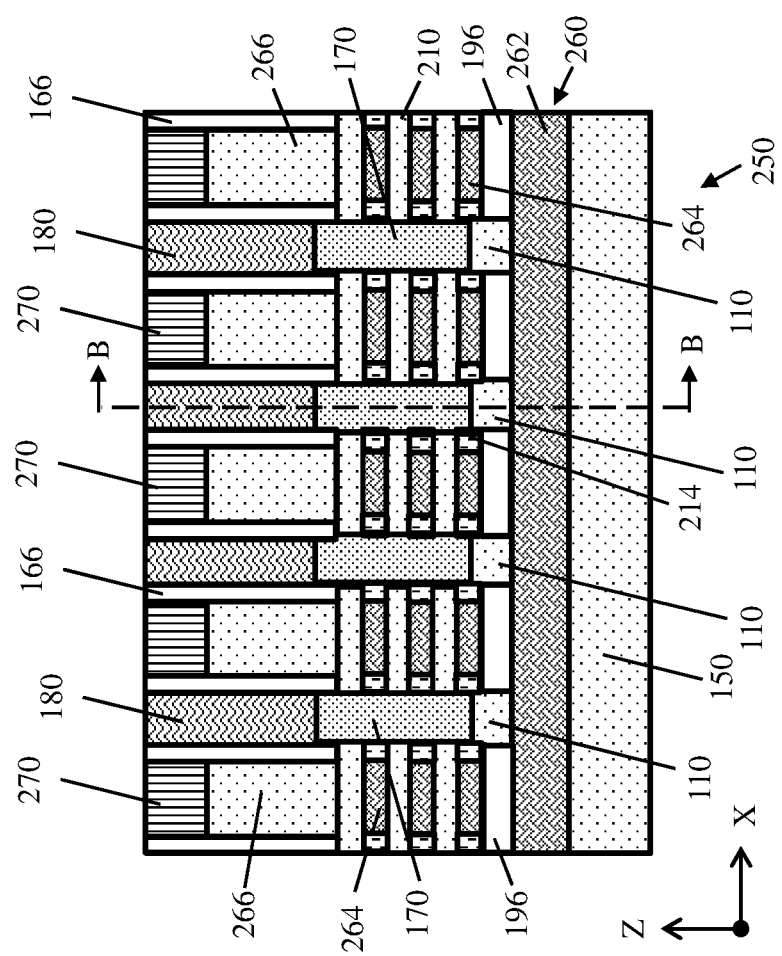
FIG. 16 shows a cross-sectional view in plane X-Z of a precursor structure to be processed in methods according to embodiments of the disclosure.

Referring to FIGS. 16 and 17 together, embodiments of the disclosure provide a method to form structure 100 (FIGS. 1-4). Methods according to the present disclosure may be integrated into fabrication processes for a variety of transistor architectures, e.g., FinFET, GAA, etc., using variants of the various processes discussed herein. Methods according to the disclosure are specifically shown and described with respect to GAA architectures solely for the sake of example. FIGS. 16 and 17 illustrate a precursor structure 250 to be processed according to embodiments of the disclosure. Precursor structure 250 may be formed and/or provided substantially in accordance with conventional methods to manufacture a transistor, and used as a basis to form insulative structure 190 (FIGS. 1-4) as described herein.

Nanosheets 210, 264 may be subdivided into distinct stacks as noted previously, e.g., by etching and removing portions of nanosheets 210, 264 between gate stacks 266. After removing targeted portions of material, the intervening space may be filled by forming a plurality of active layers 110 on base layer 192, and thereafter forming a plurality of semiconductor terminals 170 on respective active semiconductor layers 110 as noted herein. By this arrangement, adjacent layers 110 and/or terminals 170 may be horizontally separated from each other by respective stacks of nanosheets 210. Precursor structure 250 may also include, e.g., a plurality of gate stacks 266 (FIG. 16 only), each formed around a respective stack of nanosheets 210, 264 as shown. Gate stack(s) 266 may include a layer of precursor semiconductor material, e.g., amorphous silicon, configured for subsequent removal and replacement. Each gate stack 266 may also include spacer(s) 166 on its opposing sidewalls, and a gate cap 270 for preventing underlying semiconductor material of gate stack 266 from being etched. In some cases, gate stack 266 may alternatively include conductive gate material instead of a precursor semiconductor material. ILD 180 may be formed over STI(s) 140 and adjacent opposing sidewalls of base layer 262 of sacrificial material 260. In the example of FIG. 7, channel spacer 196 is shown to be interposed between ILD 180 and base layer 262. ILD 180 is also shown to be adjacent portions of semiconductor terminal 170 and gate stack(s) 266.

Figure 19:
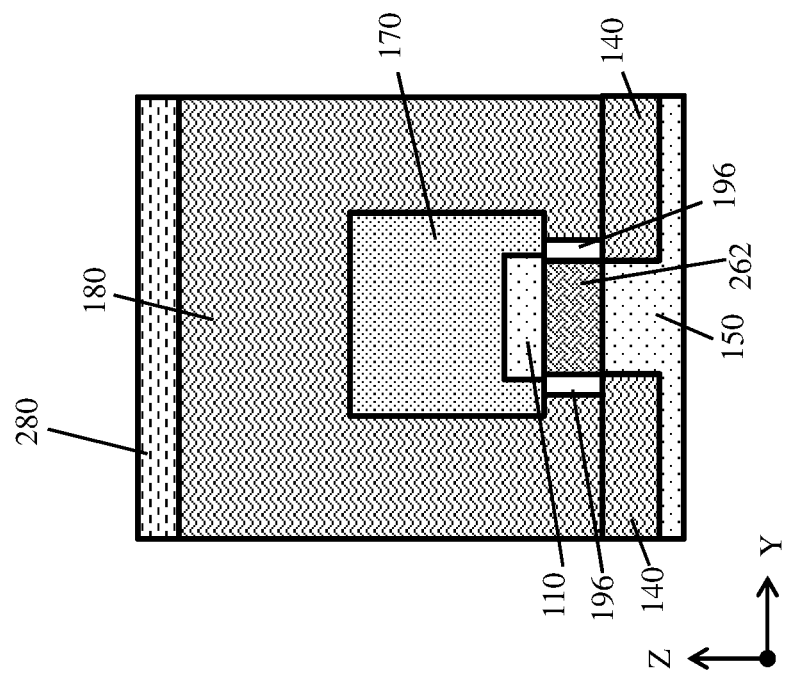
FIG. 19 shows a cross-sectional view in plane Y-Z, along line B-B of FIG. 18, of the structure while forming the first portion of the cavity according to embodiments of the disclosure.
Figure 18:
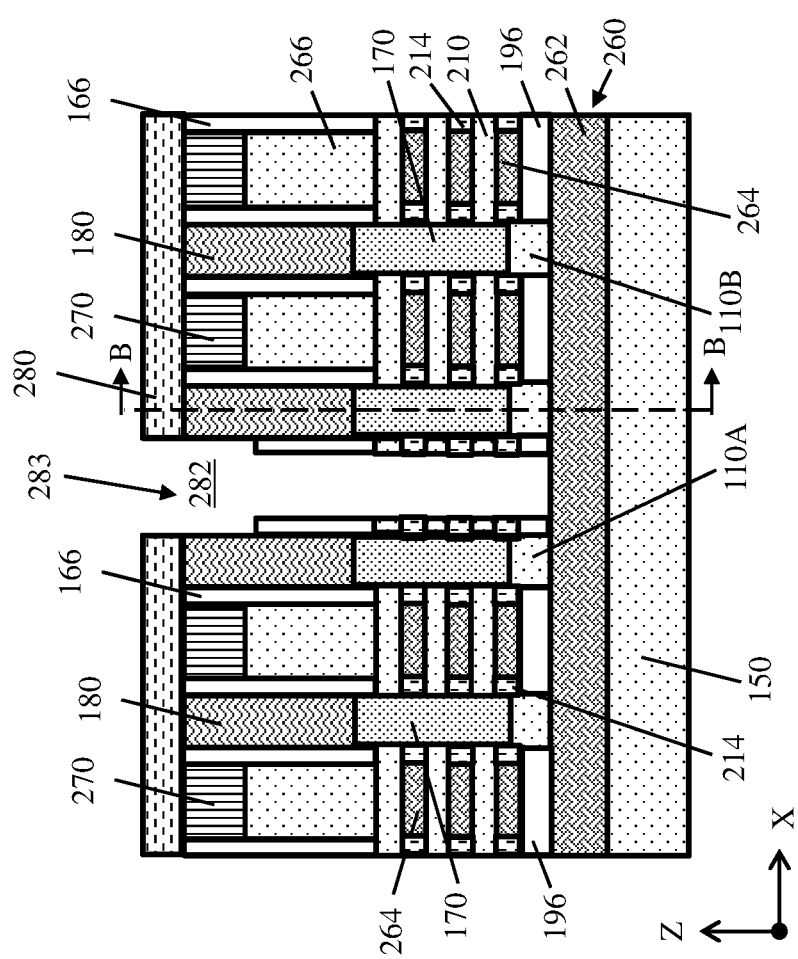
FIG. 18 shows a cross-sectional view in plane X-Z of forming a first portion of a cavity according to embodiments of the disclosure.

Turning to FIGS. 18 and 19, embodiments of the disclosure may include removing selected materials from precursor structure 250 (FIGS. 16, 17) to define the shape of insulative structure 190 (FIGS. 1-4). A first mask 280 composed of one or more layers of insulative or masking materials may be formed over ILD 180 and gate stack(s) 266 to protect selected portions thereof from being etched and removed. First mask 280 may include any currently known or later developed material configured to protect underlying materials from being selectively or non-selectively etched, and in some cases may include an organic planarization layer (OPL) material. In particular, first mask 280 may include, e.g., an insulator composed of a nitride or oxide material positioned beneath one or more layers of masking material, e.g., a silicon nitride or silicon oxide hard mask. With first mask 280 in place, an exposed portions of material may be downwardly and non-selectively etched to form a first portion 282 of a cavity 283. The removed materials may include, as shown in FIG. 18, one gate stack 266 and an underlying stack of nanosheets 210 and sacrificial nanosheets 264. The etching may expose an underlying portion of base layer 262 of sacrificial material 260. It is understood that in alternative embodiments, first mask 280 may instead include an opening over a portion of ILD 180 and an underlying semiconductor terminals 170. In this case, the etching of these materials will expose a different portion of base layer 262. As shown in FIG. 19, portions of the structure covered by first mask 280 may remain substantially intact as first portion 282 of cavity 283 is formed.

Referring now to FIGS. 20 and 21 continued processing according to the disclosure my include forming a second portion 284 of cavity 283 vertically between substrate 150 and each semiconductor terminal 170 and stack of nanosheets 210, 264. As shown, first mask 280 may be removed (e.g., by ashing, stripping, and/or other currently known or later developed techniques) before subsequent processes are implemented. To form second portion 284 of cavity 283, embodiments of the disclosure may include removing base layer 262 of sacrificial material 260 by selective etch, thereby leaving other materials intact. Where base layer 262 includes silicon germanium, a vapor phase dry etchant (e.g., a HCl or ClF$_3$-based chemistry as noted above) may be suitable to form second portion 284 of cavity 283. As shown specifically in FIG. 11, second portion 284 of cavity 283 may be formed as a tunnel vertically between substrate 150 and semiconductor terminal 170, and horizontally between portions of ILD 180 and channel spacer(s) 196. First and second portions 282, 284 of cavity 283 may define a continuous open space where materials may be deposited in subsequent processing. Etching materials and/or processes for removing germanium-containing semiconductor materials may remove base layer 262 without affecting materials without implanted geranium.

Referring now to FIGS. 22 and 23, continued processing according to the disclosure may include forming a insulative structure 190 as a continuous insulative material within first and second portions 282 (FIGS. 8-11), 284 (FIGS. 10, 11) of cavity 283. Insulative structure 190 may be deposited and planarized to remove overlying portions of insulator 190 from ILD 180 and/or gate stacks 266. The deposited insulative material may fill portions 282, 284 of cavity 283. The deposited insulative material may then be etched back to a desired depth, e.g., such that an upper surface of insulative structure 190 is below the upper surface of ILD 180 and/or gate stacks 266. As shown in FIG. 13, insulative structure 190 fills the previously hollow tunnel beneath active semiconductor layer 110 and between portions of ILD 180.

Insulative structure 190 may include isolation layer 192 and diffusion break region 194 as portions of one insulative structure 190 due to being formed by a single deposition. Insulative structure 190 may lack any structural interface between isolation layer 192 and diffusion break region 194, and these two portions of insulative structure 190 may be distinguished solely based on their position relative to nanosheets 210, 264.

Figure 25:
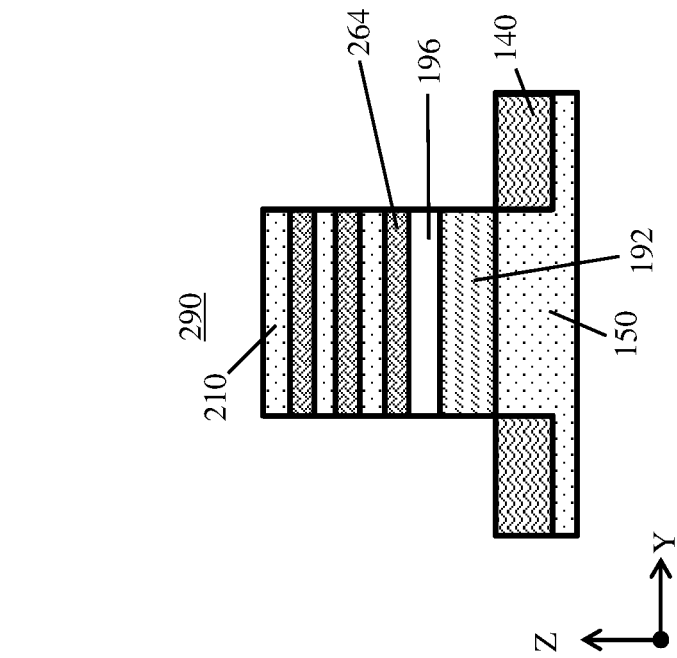
FIG. 25 shows a cross-sectional view in plane Y-Z, along line C-C of FIG. 24, of removing the initially-formed dummy gates to expose nanosheets thereunder according to embodiments of the disclosure.
Figure 24:
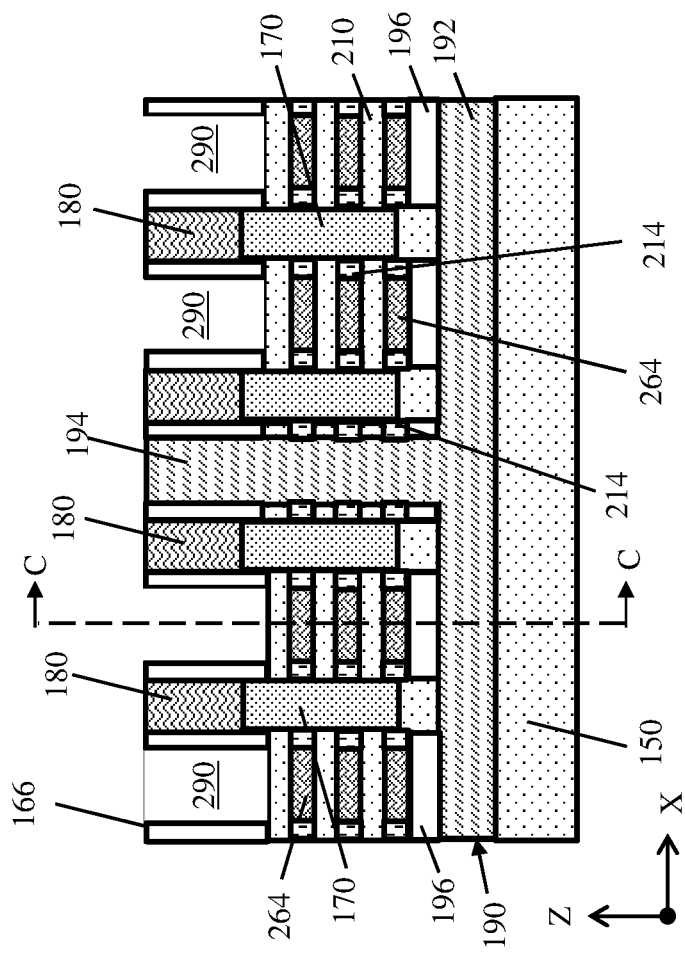
FIG. 24 shows a cross-sectional view in plane X-Z of removing the initially-formed dummy gates to expose nanosheets thereunder according to embodiments of the disclosure.

Turning to FIGS. 24 and 25, continued processing according to the disclosure may include removing portions of gate stack 266 (FIGS. 6-13) to allow remaining sacrificial material of sacrificial nanosheets 264 to be removed. FIGS. 24 and 25 depict planarizing the structure to a desired height. It is emphasized that spacer materials may be located on opposite sides of sacrificial nanosheets 264 above and below the plane of the page, and thus are not shown in FIG. 25. The structure may be planarized by any currently known or later developed planarization technique, e.g., chemical mechanical planarization (CMP). CMP generally refers to a method of removing layers of solid by chemical-mechanical polishing carried out for the purpose of surface planarization and definition of metal interconnect pattern. The same implementation of CMP may also remove gate cap(s) 270 (FIGS. 16-23) from each gate stack 266. After removing gate cap(s) 270, gate stack(s) 266 may also be removed by selective etching. In this case, gate stack(s) 266 may be etched to form gate openings 290 over nanosheets 210, 264, e.g., using one or more etchants selective to amorphous silicon. As shown specifically in FIG. 25, forming gate openings 290 may also expose sidewalls of nanosheets 210, 264.

Referring briefly to FIGS. 26 and 27, sacrificial nanosheets 264 (FIGS. 16-25) may be removed from gate opening(s) 290 by an additional application of selective etching. The selective etchant applied to gate openings 290 may be selective to germanium-containing semiconductor materials, and in a specific example may include one or more vapor phase dry etchants (e.g., HCl or ClF$_3$-based chemistries) configured to selectively etch SiGe at different rates based on the Ge concentration therein. Vapor phase dry etchants may be particularly suitable for etching within confined cavities, as they are less likely to etch or affect other materials in this situation. In alternative embodiments with different sacrificial materials, other selective wet etchants may be used. At this stage, a gate dielectric material (not shown) may be formed by selective conformal deposition on semiconductor nanosheets 210. The gate dielectric material is omitted from FIGS. 26 and 27 solely for clarity of illustration. In any case, isolation layer 192 may remain exposed at the bottom of gate opening(s) 290 as sacrificial nanosheets 264 are removed.

Figure 29:
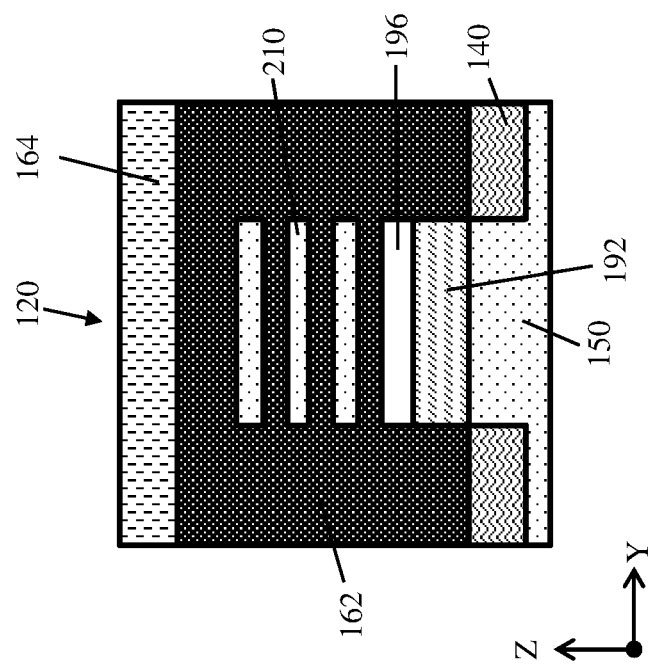
FIG. 29 shows a cross-sectional view in plane Y-Z, along line C-C of FIG. 28, of forming gate structures to surround semiconductor nanosheets and Self-Aligned Contact (SAC) cap according to embodiments of the disclosure.
Figure 28:
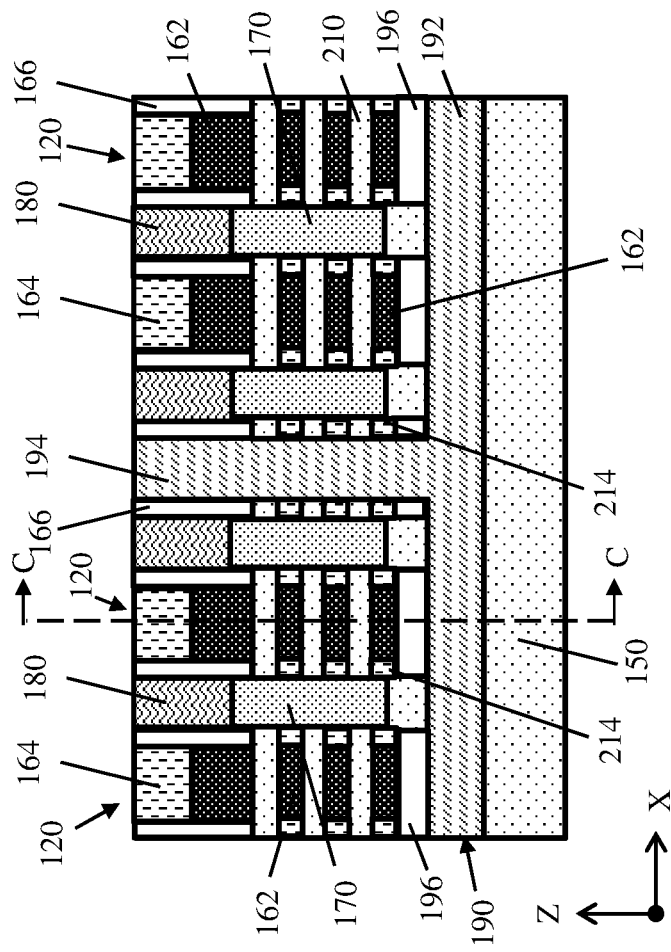
FIG. 28 shows a cross-sectional view in plane X-Z of forming gate structures to surround semiconductor nanosheets and Self-Aligned Contact (SAC) cap according to embodiments of the disclosure.

FIGS. 28 and 29 depict processes to form gate structures 120 surrounding semiconductor nanosheets 210. After forming gate openings 290 (FIGS. 26, 27) and removing sacrificial nanosheets 264, embodiments of the disclosure may include depositing a work function metal to form gate regions 162. Gate regions 162 may be formed to a desired height above semiconductor nanosheets 210 (and their respective gate dielectric material) to surround exposed surface of semiconductor nanosheets 210. A set of gate caps 164 thereafter may be formed over gate regions 162 to protect gate regions 162 from being affected by subsequent processes to form source and drain contacts.

Figure 31:
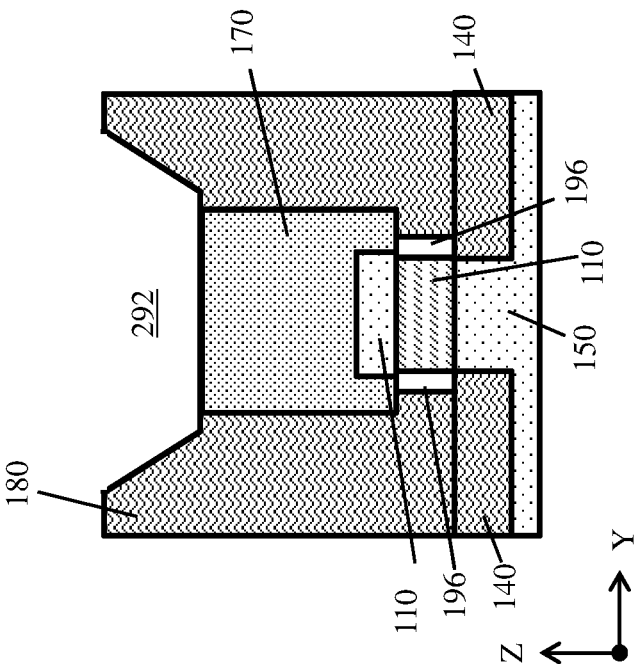
FIG. 31 shows a cross-sectional view in plane Y-Z, along line B-B of FIG. 30, of removing portions of the ILD to expose epitaxial semiconductor regions thereunder according to embodiments of the disclosure.
Figure 30:
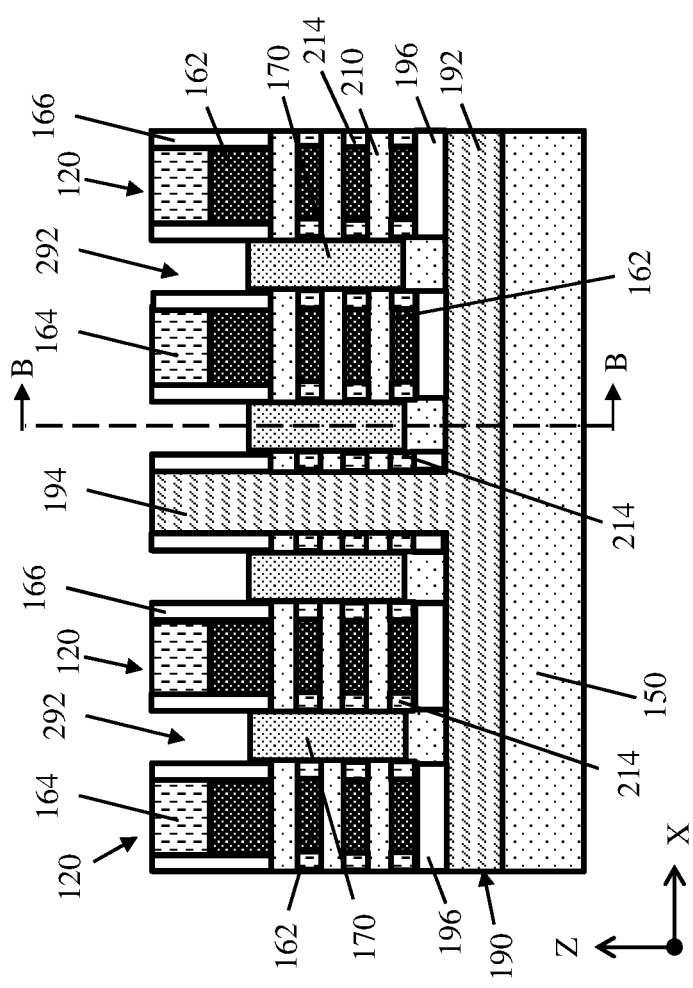
FIG. 30 shows a cross-sectional view in plane X-Z of removing portions of the ILD to expose epitaxial semiconductor regions thereunder according to embodiments of the disclosure.

Turning to FIGS. 30 and 31, continued processing may include, e.g., removing portions of ILD 180 over semiconductor terminals 170 to form a set of contact openings 292 between spacers 166. Contact openings 292 may expose an upper surface of respective semiconductor terminal(s) 170 to allow source and drain contacts to be formed. At this point, the disclosure may include filling contact openings 292 with a conductive metal to yield structure 100 substantially as depicted in FIG. 3. Insulative structure 190 may be integrated into the forming a GAA transistor architecture, and embodiments of the method discussed herein may be similarly adapted to FinFET transistor structures or other transistor architectures.

Figure 32:
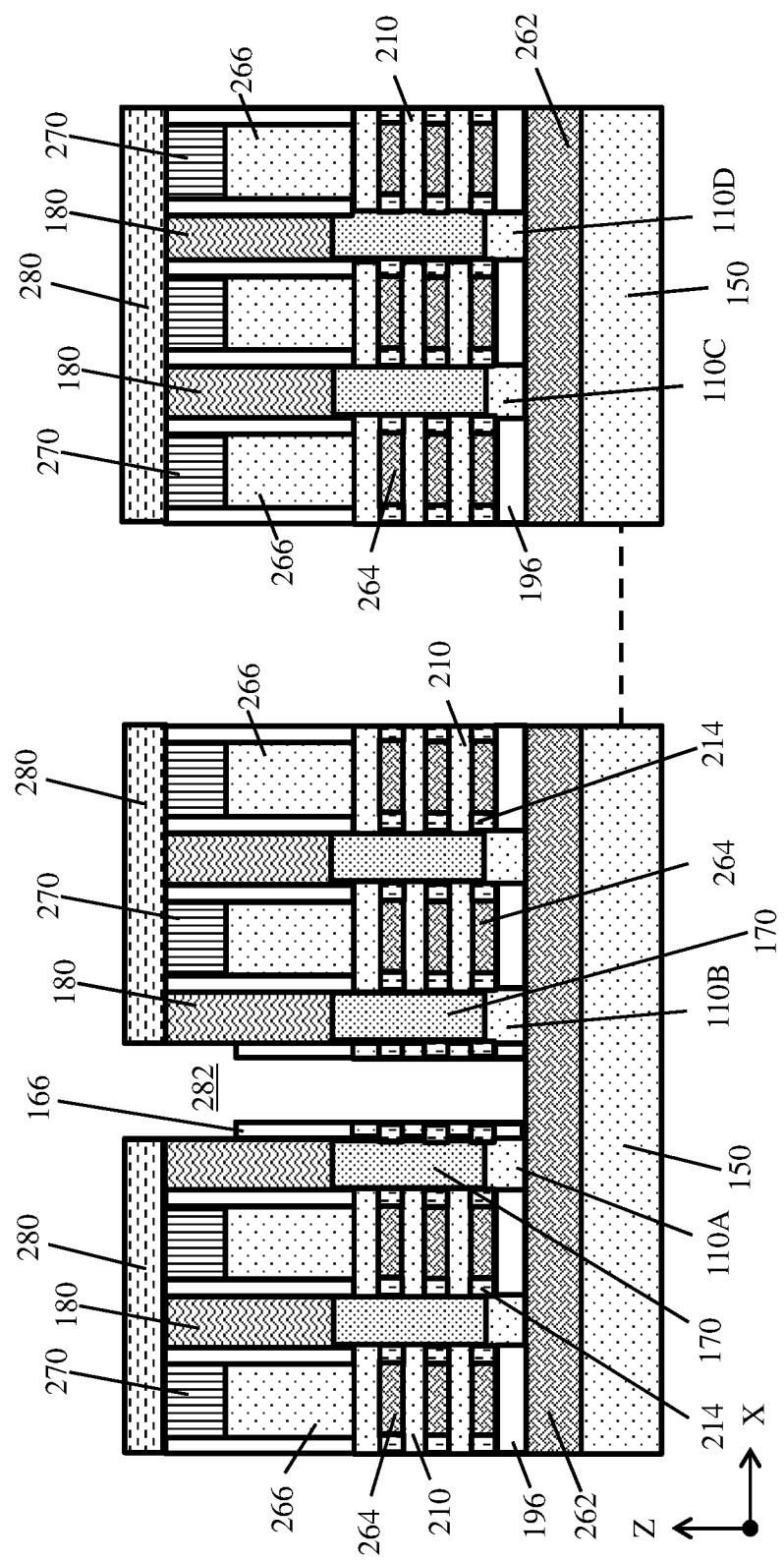
FIG. 32 shows a cross-sectional view in plane X-Z of forming a first portion of the cavity by removing a targeted gate stack according to embodiments of the disclosure.

Referring now to FIG. 32, alternative embodiments of the disclosure may include forming insulative structure 190 (FIGS. 1-4, 12-31) to include several diffusion break regions therein. To provide this feature, additional portions of cavity 283 may be formed with the aid of several masks before filling cavity 283 with insulative structure 190 material. In other respects, the structures described herein may be processed substantially identically to other embodiments of the disclosure. FIGS. 32-38 in particular illustrate forming insulative structure 190 in cavity 283 with three distinct portions. FIG. 32 depicts first portion 282 of cavity 283 being formed between portions of ILD 180 and active semiconductor layers 110A, 110B with first mask 280 in place. Another location of the structure, offset with a broken line to note indeterminate distance, may be fully covered by first mask 280. Two other active semiconductor layers 110C, 110D may be covered by first mask 280 at this stage. First portion 282 of cavity 283 may be etched to expose base layer 262 of sacrificial material 260 as described elsewhere herein.

Figure 33:
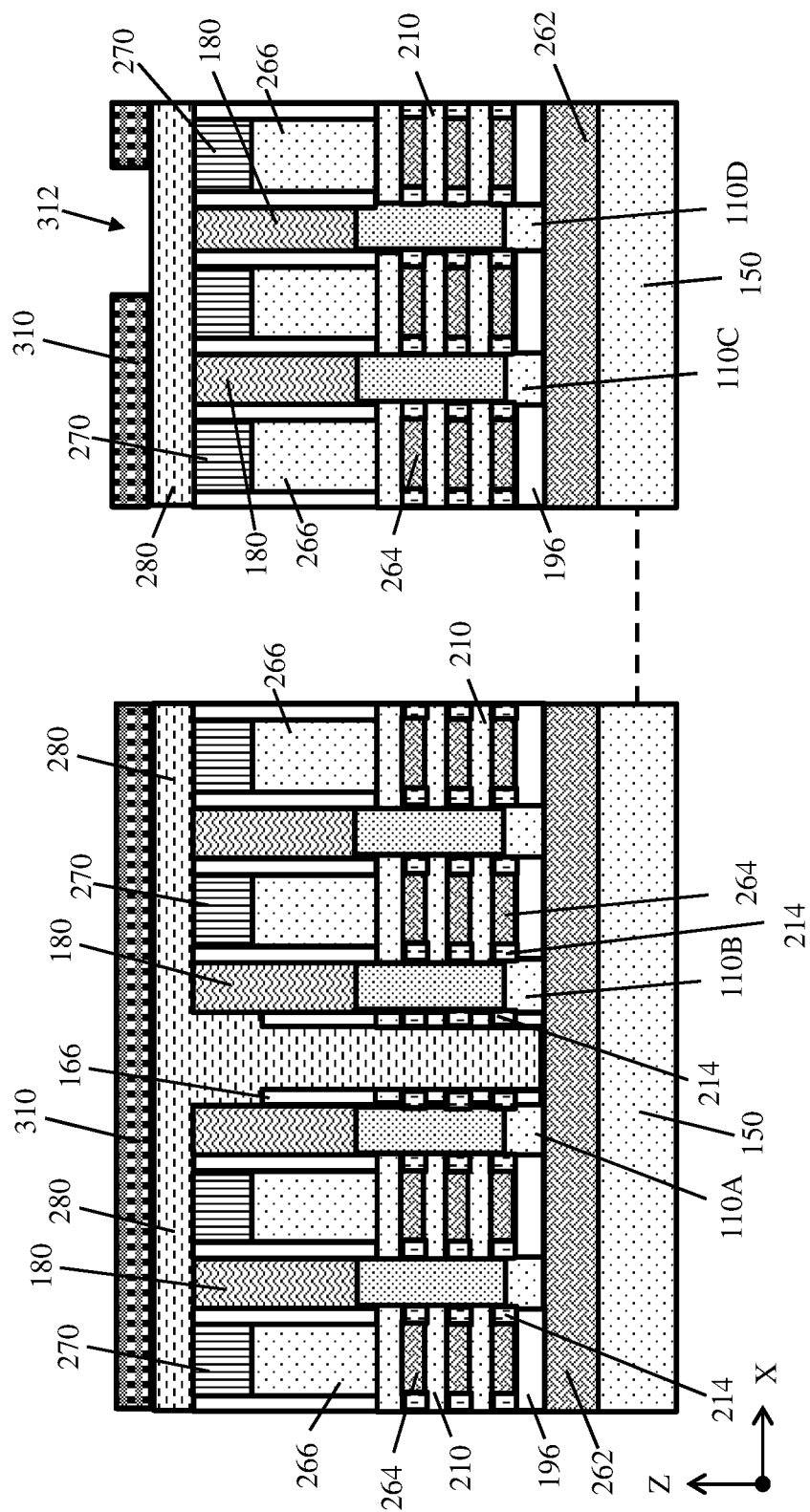
FIG. 33 shows a cross-sectional view in plane X-Z of filling the first portion of the cavity with the first mask and forming a second mask thereon according to embodiments of the disclosure.

Turning to FIG. 33, first portion 282 (FIG. 32) of cavity 283 may be filled with OPL material or a similar masking material, thereby increasing the size of first mask 280. As shown, first mask 280 may be deposited to fill first portion 282 of cavity 283 and optionally to enlarge first mask 280 over ILD 180 and gate stacks 266. With enlarged first mask 280 in place within first portion 282 of cavity 283, continued processing may include forming a second mask 310 over first mask 280. Second mask 310 may include, e.g., one or more mask openings 312 over first mask 280 above a selected portion of ILD 180 and active layer 110 (specifically, layer 110D in FIG. 33).

Figure 34:
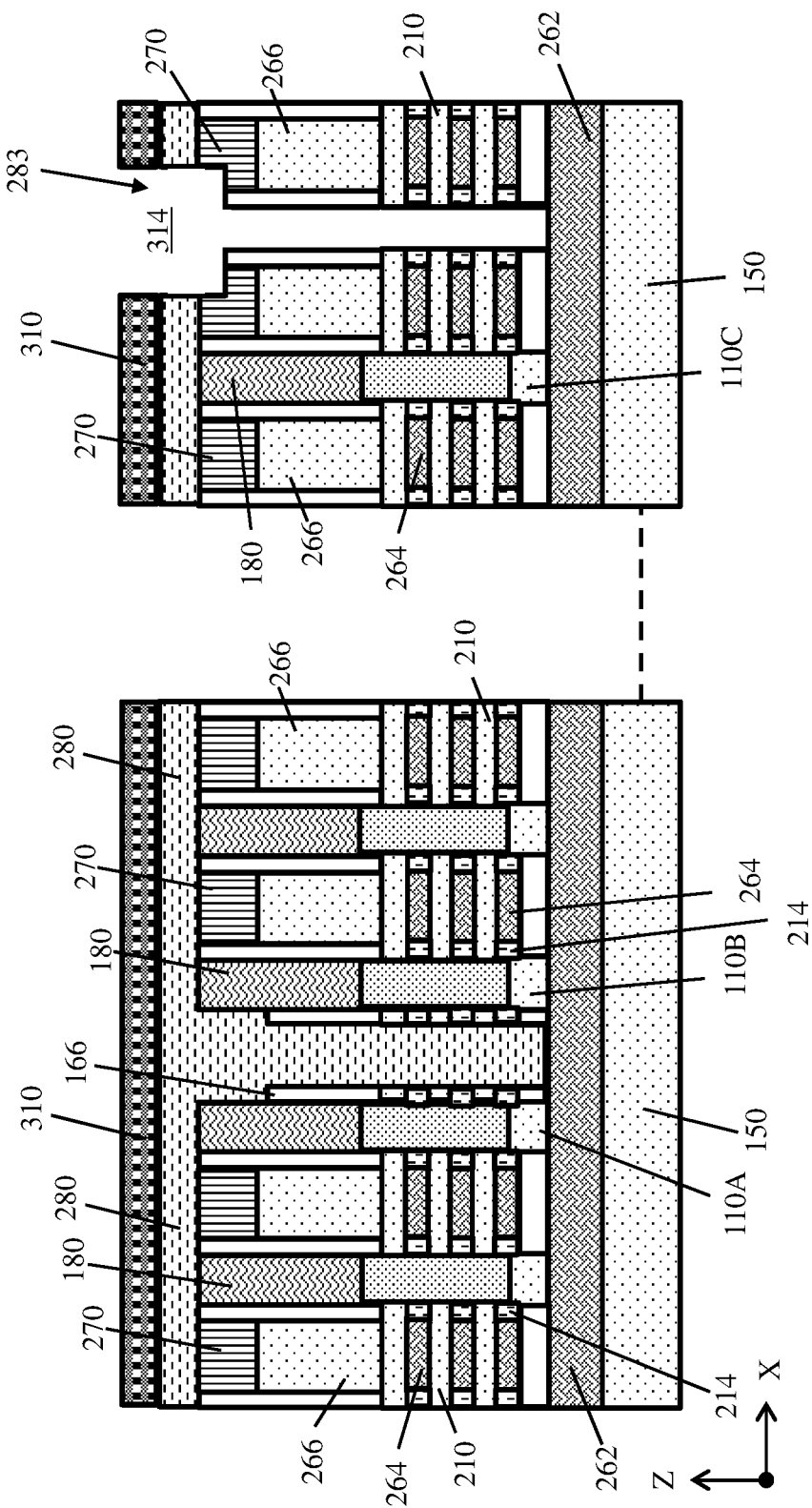
FIG. 34 shows a cross-sectional view in plane X-Z of forming a third portion of the cavity by removing a targeted portion of ILD and epitaxial semiconductor material according to embodiments of the disclosure.

FIG. 34 depicts continued processing of the structure to include one or more additional diffusion break regions. With second mask 310 in place, materials exposed by mask opening 312 may be etched away (e.g., by downward non-selective etch or alternatively by selective etch) to reveal base layer 262 of sacrificial material 260. The etching may leave exposed portions of gate stack(s) 266 and/or nanosheets 210, 264 substantially intact, as compared to removing such materials to form first portion 282 of cavity 283. The etching may form a third portion 314 of cavity 283 above sacrificial material 260.

Figure 35:
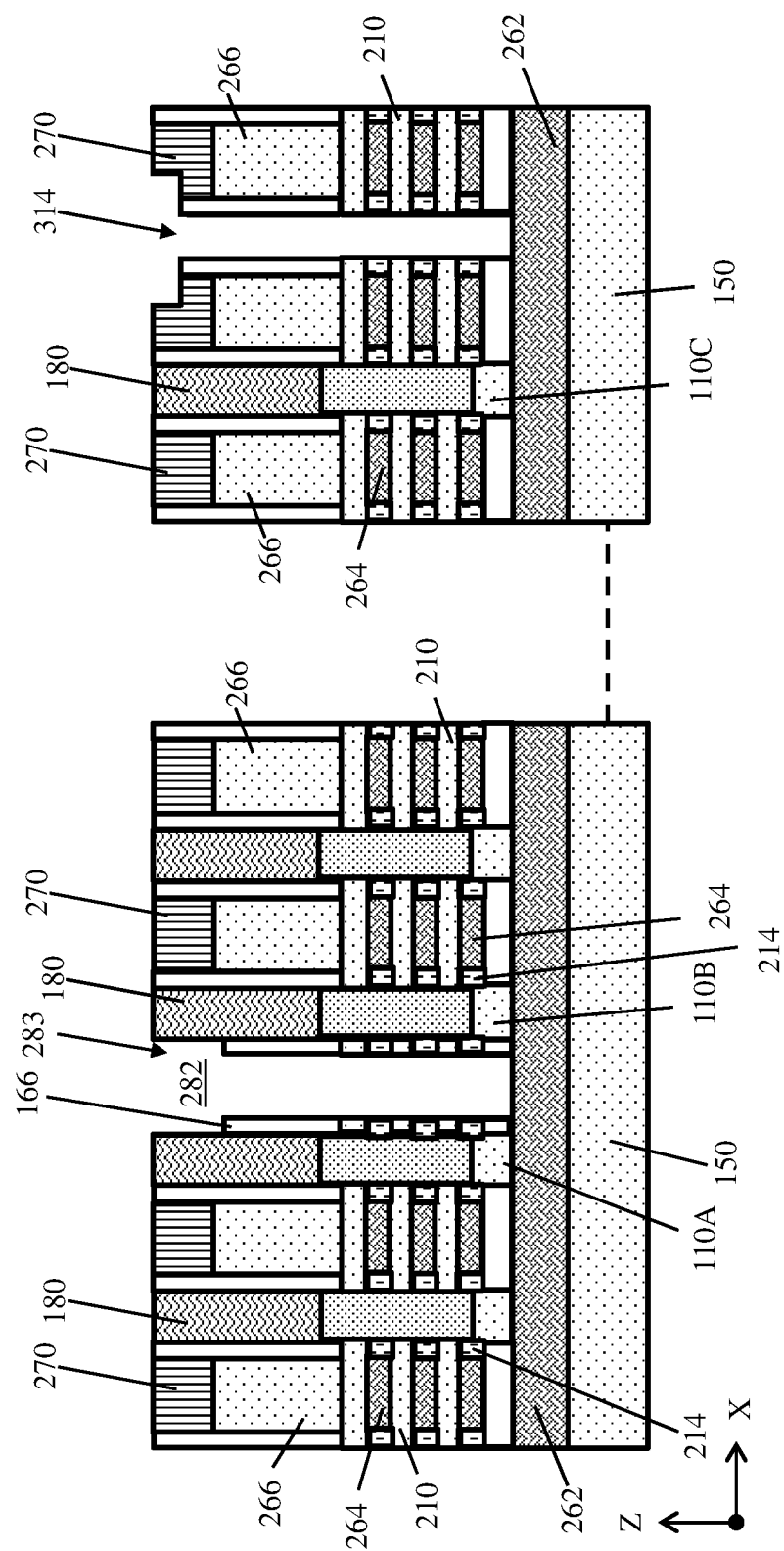
FIG. 35 shows a cross-sectional view in plane X-Z of removing the OPL to expose portions of sacrificial material according to embodiments of the disclosure.

Continuing to FIG. 35, the previously-formed masking materials may be removed to expose each previously-formed first and third portions 282, 314 of cavity 283 where insulative materials will be deposited. As shown, first and second masks 280 (FIGS. 28-20), 310 (FIGS. 29, 30) may be removed by stripping and/or selective etch. First and third portions 282, 314 of cavity 283 may each appear at respective locations between distinct portions of the structure. Second portion 284 of cavity 283 has not yet been formed, due to the continued presence of base layer 262 of sacrificial material 260 at this stage. First portion 282 of cavity 283 appears horizontally between portions of active semiconductor layer 110, semiconductor terminals 170, and ILD 180. Third portion 314 by contrast appears horizontally between stacks of nanosheets 210, 264.

Figure 36:
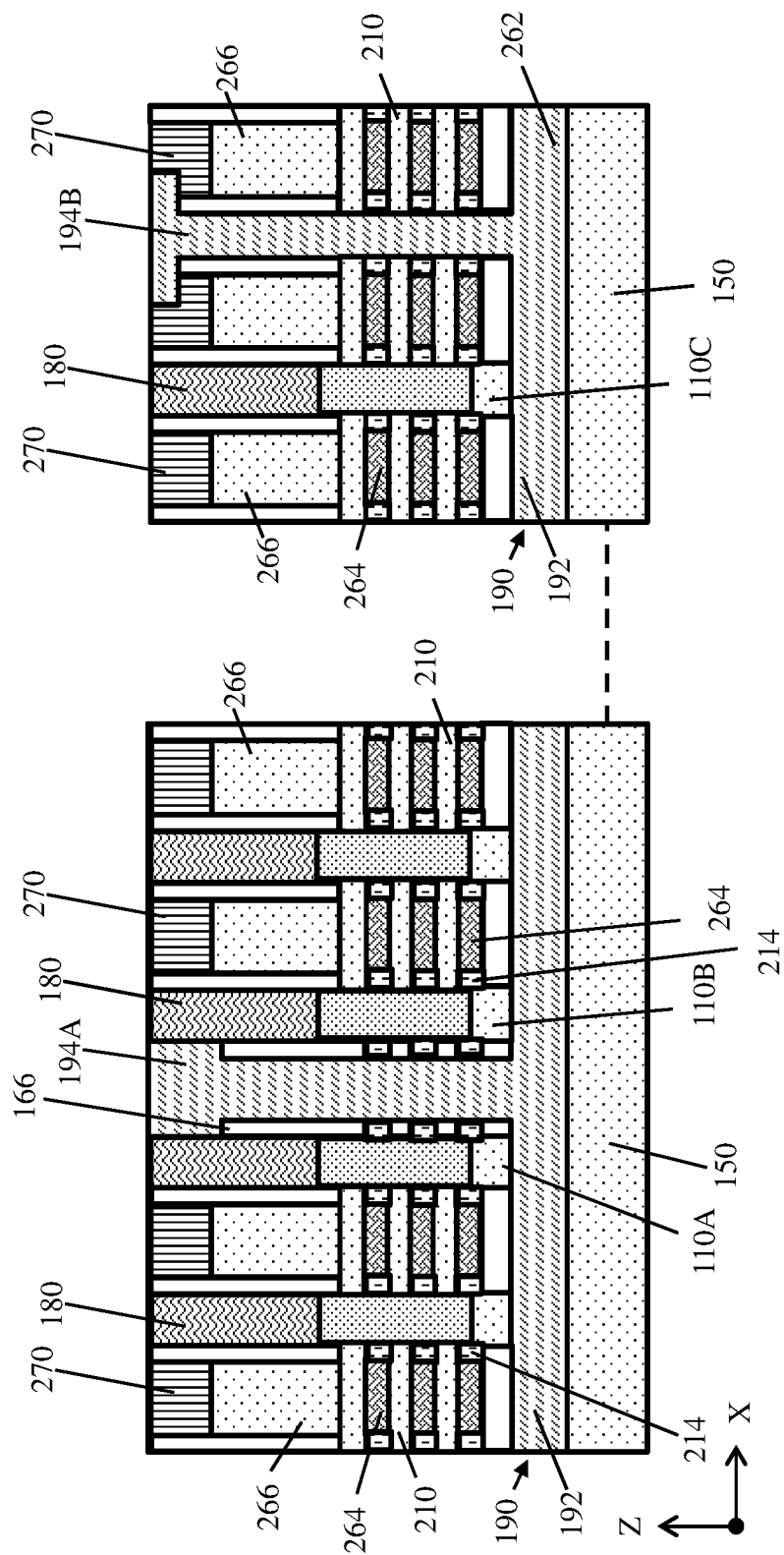
FIG. 36 shows a cross-sectional view in plane X-Z of forming an insulative structure within the cavity according to embodiments of the disclosure.

FIG. 36 depicts removing sacrificial base layer 262, and depositing an insulator in each portion of cavity 283 to form insulative structure 190 according to further embodiments. Insulative structure 190 may include diffusion break region 194A as a single diffusion break (SDB) region, i.e., an electrical insulator formed between to semiconductor terminal materials. Elsewhere on structure 100, however, insulative structure 190 may also include another diffusion break region 194B as a double diffusion break (DDB) region, i.e., an electrical terminal formed between two channel regions of two transistor structures. Nonetheless, insulative structure 190 may include a single isolation layer 192 above substrate 150 and integral with each diffusion break region 194A, 194B. Embodiments of structure 100 with each type of diffusion break region 194A, 194B may be particularly suitable for transistors with different operational purposes in a device. For example, diffusion break region 194A may horizontally separate a set of logic transistors at one location of structure 100, while diffusion break region 194B may horizontally separate a set of memory transistors (SRAM) at a different location of structure 100. These two different sets of transistors may have distinct dimensional requirements. Thus, the presence of two distinct diffusion break regions 194A, 194B may allow insulative structure 190 to be modified and adapted to suit different kinds of devices without substantially departing from the embodiments described herein.

Figure 37:
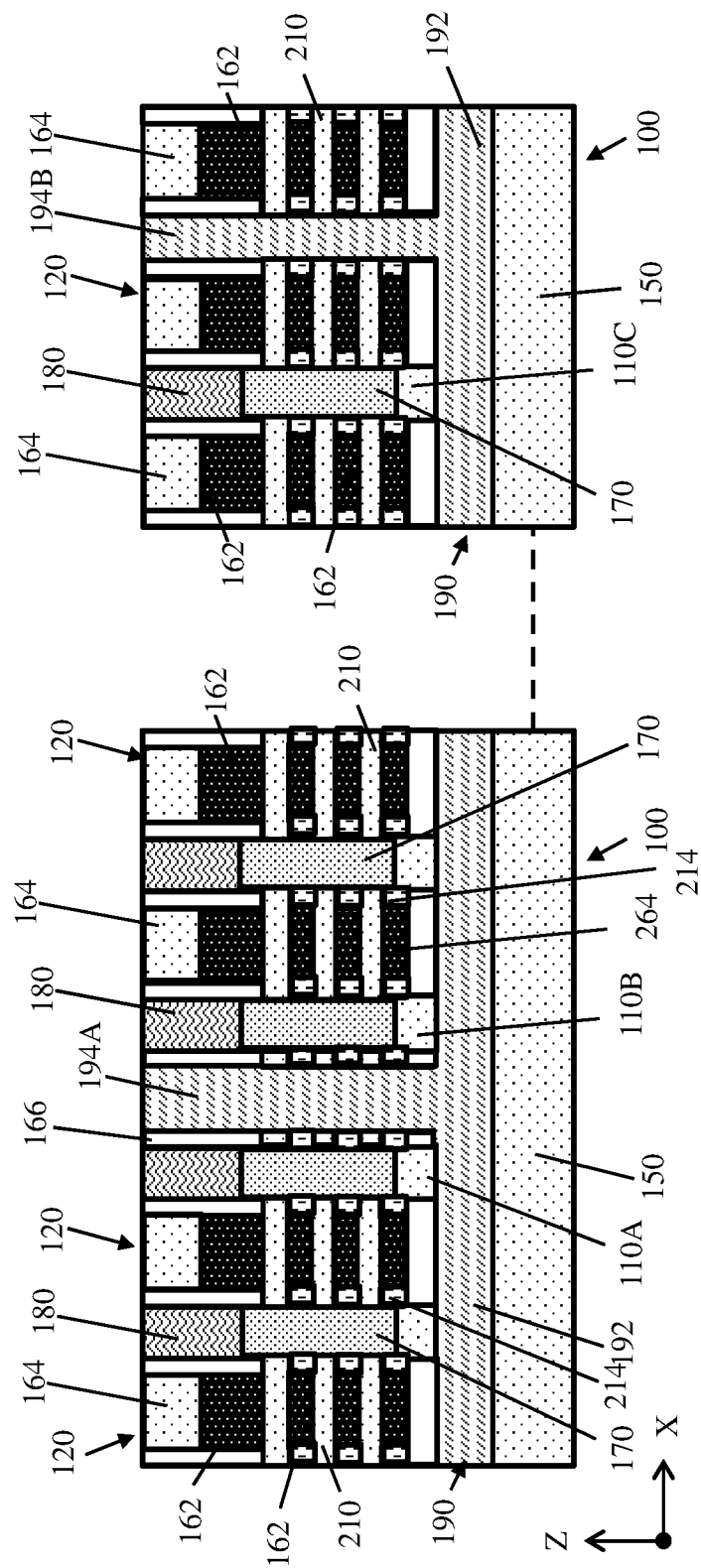
FIG. 37 shows a cross-sectional view in plane X-Z of forming gate structures in place of the initially-formed gate stacks according to embodiments of the disclosure.

Turning now to FIG. 37, processing may continue in substantially the same manner as other embodiments with insulative structure 190 and each diffusion break regions 194A, 194B in place. FIG. 37 depicts removing gate stacks 266 (FIGS. 32-36) and gate caps 270 (FIGS. 32-36) to expose nanosheets 210, 264 thereunder substantially as described with respect to other embodiments. Additionally, FIG. 27 depicts replacing the removed gate stacks 266 and gate caps 270 with gate structures, including gate region 264 for controlling the flow of electricity across semiconductor nanosheets 210.

Figure 38:
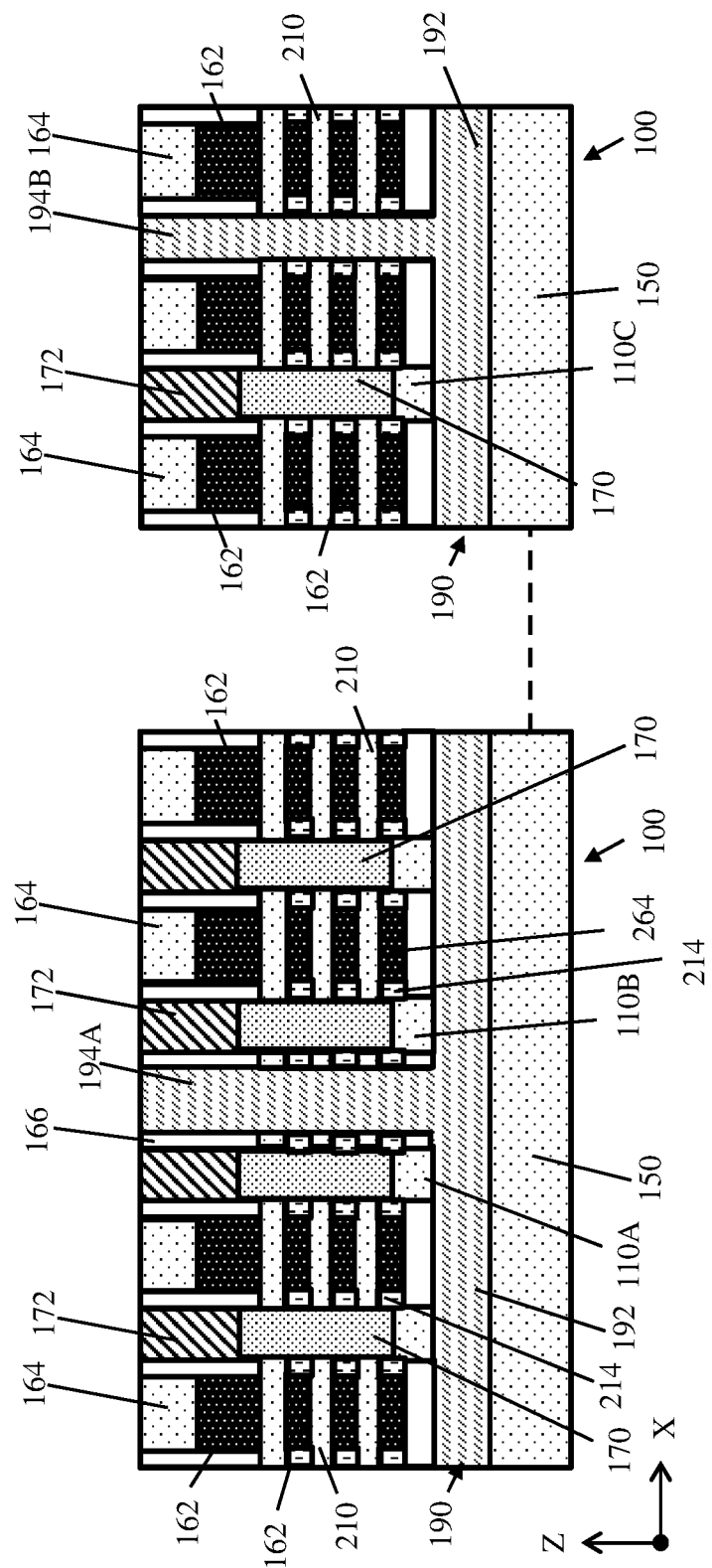
FIG. 38 shows a cross-sectional view in plane X-Z of forming source and drain contacts to provide a structure with multiple diffusion break regions according to embodiments of the disclosure.

FIG. 38 depicts a further processing step to form an embodiment of structure 100 with multiple diffusion break regions 194A, 194B in insulative structure 190. As shown, portions of ILD 180 (FIG. 37) may be targeted and removed, e.g., by etching, to expose semiconductor terminals 170 thereunder. Source and drain contacts 172 may then be formed in place of the removed ILD 180 material to create structure 100 with insulative structure 190 in place. As shown, structure 100 may include multiple diffusion break regions 194A, 194B with only slight alterations to other embodiments for forming structure 100 with only one type of diffusion break region 194. It is thus understood that insulative structure 190 of structure 100 may be adjusted and modified for use in a variety of devices and/or for separating various types of transistors, including memory and logic transistors at different device locations as noted elsewhere herein.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. For example, while the present disclosure describes a process related to nanosheet devices, it is anticipated that a similar process may be applied to FinFET devices. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure comprising:
   a substrate;
   a set of shallow trench isolations (STIs) adjacent opposing sidewalls of the substrate;
   an insulative structure overlying the substrate, the insulative structure including:
     an isolation layer contacting an upper surface of the substrate, and
     a diffusion break region integral with and extending from the isolation layer, wherein the diffusion break region horizontally separates a pair of upper surfaces of the isolation layer;
   a pair of active semiconductor layers each positioned on a respective one of the pair of upper surfaces of the isolation layer, each active semiconductor layer being adjacent an opposing sidewall of the diffusion break region; and
   an inter-level dielectric (ILD) over the set of STIs and adjacent opposing sidewalls of the insulative structure;
   wherein the isolation layer electrically separates the pair of active semiconductor layers from the substrate, and wherein the diffusion break region electrically separates the pair of active semiconductor layers from each other.

2. The IC structure of claim 1, wherein the insulative structure includes a low-k dielectric material different from a composition of the set of STIs and the ILD.

3. The IC structure of claim 1, wherein each of the pair of active semiconductor layers comprise portions of a respective nanosheet transistor.

4. The IC structure of claim 1, wherein each of the pair of active semiconductor layers comprise portions of a respective FinFET transistor.

5. The IC structure of claim 1, wherein the diffusion break region comprises a single diffusion break (SDB) region, and wherein the pair of active semiconductor layers comprise portions of a set of logic transistors.

6. The IC structure of claim 1, wherein the diffusion break region comprises a double diffusion break (DDB) region, and wherein the pair of active semiconductor layers comprise portions of a set of memory transistors.

7. The IC structure of claim 1, further comprising a pair of spacers alongside opposing sidewalls of the isolation layer, wherein at least a portion of the pair of active semiconductor layers is positioned above the pair of spacers.

8. An integrated circuit (IC) structure comprising:
   a substrate;
   a set of shallow trench isolations (STIs) adjacent opposing sidewalls of the substrate;
   an insulative structure overlying the substrate, the insulative structure including:
     an isolation layer contacting an upper surface of the substrate, and
     a diffusion break region integral with and extending from the isolation layer, wherein the diffusion break region horizontally separates a pair of upper surfaces of the isolation layer;
   a pair of transistors each positioned on a respective one of the pair of upper surfaces of the isolation layer, each transistor being adjacent an opposing sidewall of the diffusion break region, wherein each of the pair of transistors includes:
     a nanosheet stack above the isolation layer, the nanosheet stack including a plurality of semiconductor nanosheets alternating with a plurality of gate metals,
     a gate region around the nanosheet stack, the gate region including a gate metal,
     a pair of semiconductor terminals, each semiconductor terminal adjacent a respective sidewall of the nanosheet stack, and
     a spacer layer horizontally between one of the pair of active semiconductor layers and the diffusion break region; and
   an inter-level dielectric (ILD) over the STI and adjacent opposing sidewalls of the insulative structure and the pair of transistors;
   wherein the isolation layer electrically separates the pair of transistors from the substrate, and wherein the diffusion break region electrically separates the pair of transistors from each other.

9. The IC structure of claim 8, wherein the insulative structure includes a dielectric material different from a composition of the set of STIs and the ILD.

10. The IC structure of claim 8, wherein the diffusion break region comprises a single diffusion break (SDB) region, and wherein the pair of transistors comprises a set of logic transistors.

11. The IC structure of claim 8, wherein the diffusion break region comprises a double diffusion break (DDB) region, and wherein the pair of transistors comprises a set of memory transistors.

12. The IC structure of claim 8, further comprising a pair of spacers alongside opposing sidewalls of the isolation layer, wherein at least a portion of the pair of semiconductor terminals is positioned on the pair of spacers.

13. The IC structure of claim 8, wherein a vertical height of the isolation layer between the substrate and the pair of transistors is at most approximately ten nanometers (nm), and a horizontal width of the diffusion break region between the pair of transistors is at most approximately fifteen nanometers (nm).

14. The IC structure of claim 8, further comprising an active semiconductor layer vertically between the isolation layer and one of the pair of semiconductor terminals, and horizontally adjacent the spacer layer.

15. A method of forming an integrated circuit (IC) structure, the method comprising:
   providing a precursor structure including:
     a substrate,
     a set of shallow trench isolations (STIs) adjacent opposing sidewalls of the substrate,
     a sacrificial material on the substrate, the sacrificial material having a different composition from the substrate, a plurality of active semiconductor layers on an upper surface of the sacrificial material, the plurality of active semiconductor layers being horizontally separated from each other, a plurality of nanosheet stacks over the sacrificial material and extending between adjacent pairs of the plurality of semiconductor terminals, a plurality of gate stacks, each formed around a respective one of the plurality of nanosheet stacks;

forming a cavity within the precursor structure, wherein the forming includes:

forming a first portion of the cavity by removing: one of the plurality of semiconductor terminals, or one plurality of gate stacks and an underlying one of the plurality of nanosheet stacks, to expose a portion of the sacrificial material, and forming a second portion of the cavity vertically between the substrate and each of the plurality of semiconductor terminals and the plurality of nanosheet stacks by selectively removing the sacrificial material; and forming an insulative structure within the first and second portions of the cavity.

16. The method of claim 15, wherein one of the active semiconductor layers includes a plurality of semiconductor nanosheets alternating with a plurality of sacrificial nanosheets, and further comprising removing the plurality of sacrificial nanosheets after forming the insulative structure.

17. The method of claim 16, further comprising forming a plurality of gate metal layers between the plurality of semiconductor nanosheets, after removing the plurality of sacrificial layers.

18. The method of claim 15, wherein forming the cavity further includes:

forming an organic planarizing layer (OPL) over the sacrificial material after forming the first portion of the cavity;

forming a third portion of the cavity by removing the other of one of the portion of the STI and the underlying one of the plurality of semiconductor terminals, or one plurality of gate stacks and the underlying one of the plurality of nanosheet stacks, to expose another underlying portion of the sacrificial material;

removing the OPL after forming the third portion of the cavity; and forming the insulative structure within the third portion of the cavity.

19. The method of claim 15, further comprising:

replacing a remaining subset of the plurality of gate stacks with a metal gate after forming the insulative structure; and forming source and drain contacts to a remaining subset of the plurality of semiconductor terminals after forming the insulative structure.

20. The method of claim 15, wherein the sacrificial material includes silicon germanium (SiGe), and wherein forming the second portion of the cavity includes selectively etching the SiGe.

* * * * *